United States Patent [19]
Yamaguchi et al.

[11] Patent Number: 6,043,435
[45] Date of Patent: Mar. 28, 2000

[54] CONDUCTING SECTION DEVICE AND METHOD FOR MANUFACTURING THE SAME

[75] Inventors: Takayuki Yamaguchi, Chiryu; Katsura Sugiura, Handa, both of Japan

[73] Assignee: Tokai Kogyo Kabushiki Kaisha, Obu, Japan

[21] Appl. No.: 08/983,509
[22] PCT Filed: May 29, 1997
[86] PCT No.: PCT/JP97/01832
§ 371 Date: Jan. 28, 1998
§ 102(e) Date: Jan. 28, 1998
[87] PCT Pub. No.: WO97/46058
PCT Pub. Date: Dec. 4, 1997

[30] Foreign Application Priority Data
May 29, 1996 [JP] Japan .................................. 8-135250

[51] Int. Cl.[7] .............................. H01B 17/00; H01B 7/08
[52] U.S. Cl. .................................. 174/138 G; 174/117 F; 174/117 FF
[58] Field of Search ................. 29/829, 412; 174/138 G, 174/110 R, 117 F, 72 F, 117 FF

[56] References Cited

U.S. PATENT DOCUMENTS

| | | |
|---|---|---|
| 3,108,154 | 10/1963 | Cound ...................................... 174/70 |
| 3,239,916 | 3/1966 | Love ....................................... 29/155.5 |
| 4,554,613 | 11/1985 | Kaufman .................................. 361/386 |
| 4,635,359 | 1/1987 | Nozick ....................................... 29/878 |
| 5,408,050 | 4/1995 | Kashio .................................. 174/117 F |
| 5,434,749 | 7/1995 | Nakayama ............................... 361/775 |
| 5,821,465 | 10/1998 | Tanaka et al. ......................... 174/88 R |

FOREIGN PATENT DOCUMENTS

| | | |
|---|---|---|
| 52-140870 | 11/1977 | Japan . |
| 55-44728 | 3/1980 | Japan . |
| 60-4289 | 1/1985 | Japan . |
| 7-221436 | 8/1996 | Japan . |

*Primary Examiner*—Kristine Kincaid
*Assistant Examiner*—Mark Olds
*Attorney, Agent, or Firm*—Dennison, Scheiner, Schultz & Wakeman

[57] ABSTRACT

The invention relates to a conductive portion device (300) having a plurality of independent conductive portions and attached to an attaching base member (360). The device includes a film (310) and a plurality of conductive materials (321, 322 and 323) to be attached to the film (310), which constitute the respective independent conductive portions, and the device further has holes (302a to 302d) corresponding to protrusions (362a to 362d) formed on the attaching base member (360).

6 Claims, 18 Drawing Sheets

CONDUCTING SECTION DEVICE AND METHOD FOR MANUFACTURING THE SAME

CROSS-REFERENCES TO RELATED APPLICATIONS

This application is a continuation of PCT Application PCT/JP97/01832, filed May 29, 1997, designating the United States, which claims priority from Japan application no. 08-13250 filed May 29, 1996.

TECHNICAL FIELD

The present invention relates to a conductive portion device having a plurality of independent conductive portions and a method for manufacturing the same.

BACKGROUND ART

Conventionally, printing is available as a technique of forming a plurality of independent conductive portions on circuit substrates, etc. However, in this case, it is impossible to assemble electric circuit elements such as capacitors in and attach the same to the conductive portions by electric welding (resistance welding).

Therefore, in a case of forming a plurality of independent conductive portions in which electric welding is able to be carried out in order to assemble electric circuit elements such as capacitors, and attach the same on a circuit substrate, a worker has manually disposed a conductive material (electric line) which forms the respective conductive portions.

However, with such a manual disposing by a worker as described above, the production efficiency thereof is not good. Furthermore, it is not favorable in view of saving space if a device having a plurality of independent conductive portions is thick.

It is, accordingly, an object of the invention to provide a conductive portion device in which a plurality of independent conductive portions can be efficiently formed and which is able to attempt to save space.

Furthermore, it is preferable that the above-mentioned conductive portion device is incorporated at an appointed place with respect to a material to be assembled such as a circuit substrate.

It is, accordingly, another object of the invention to provide a conductive portion device which is able to be easily assembled and incorporated at an appointed plate with respect to a material to be assembled such as a circuit substrate.

Furthermore, when manufacturing the above-mentioned conductive portion device, in a case where a worker manually disposes a plurality of independent conductive materials (electric lines), it is difficult to dispose the respective conductive materials with an appropriate positional relationship among them. For example, in a case where the respective conductive materials are disposed very adjacent thereto, it is difficult to dispose the conductive materials so that the clearance thereof is set as per appointed.

Therefore, it is still another object of the invention to provide a method for manufacturing a conductive portion device, by which a plurality of independent conductive materials are easily disposed with an appointed positional relationship.

Still furthermore, it is a further object of the invention to provide a method for manufacturing a conductive portion device, which is able to easily produce conductive portion devices which can be assembled in and attached to a material to be assembled such as a circuit substrate in a well positioned state, in the above-mentioned manufacturing method.

DISCLOSURE OF THE INVENTION

A first aspect of the invention is a conductive portion device having a plurality of independent conductive portions, which comprises an insulation film and a plurality of conductive materials attached to the insulation film and constituting the respective independent conductive portions.

With the first aspect of the invention, since a plurality of conductive materials are attached to an insulation film with their relative positions determined, it is possible to dispose a plurality of conductive materials simultaneously with assembling or attaching the conductive portion device to an electric circuit substrate, etc. Thus, this is more efficient than disposing the conductive materials one by one.

Furthermore, since the conductive materials are attached to the insulation film with their relative positions predetermined in any appointed state, it is possible to assemble the conductive materials more efficiently than a case where conductive materials are assembled one by one to an electric circuit, etc. with their relative positions held in any appointed state.

Furthermore, since a plurality of conductive materials are attached to an insulation film, the space of the conductive portion device can be reduced, thereby making it possible to further save the space thereof.

Furthermore, as an example of the invention, there is a case where a plurality of conductive material which constitute the above-mentioned respective independent conductive portions may be adhered to an insulation film by an adhesive agent, etc.

A second aspect of the invention is a conductive portion device having a plurality of independent conductive portions, which comprises a plurality of conductive materials which constitute the respective independent conductive portions and thermoplastic insulation films thermally bonded at both the sides of a plane constituted by the plurality of conductive materials.

With the second aspect of the invention, since both the surfaces of the conductive materials are covered by insulation films, the following effects can be produced in addition to the operation and effect of the first aspect of the invention.

That is, in a case where an insulation film exists at only one surface as in the first aspect of the invention, if, when producing a conductive portion device, the conductive material is adhered by coating an adhesive agent onto the entirety of the rear surface of the insulation film, the adhesive agent may remain at places where no conductive material exists on the rear surface of the insulation film and may still be adhesive, and they may be adhered to other members than the appointed members. However, with the second aspect of the invention, since insulation films exist on both the sides, both the sides do not have any adhesivity, and the above-noted shortcoming can be avoided.

A third aspect of the invention is a conductive portion device to be attached to an attaching base member as set forth in the first or the second aspect of the invention, wherein a hole corresponding to a protrusion formed on the attaching base member is formed.

The "hole" is formed on the conductive film at points where only the insulation film exists in the conductive portion device and is formed at the conductive material at points where only the conductive materials exist in the conductive portion device. At points where the insulation film and conductive material are overlapped in the conductive portion device, the hole is formed at both of them. Furthermore, the holes may include those, capable of acting as a hole with its entirety, in which cutouts are formed at points corresponding to a conductive material adjacent to the point where no insulation film exists.

Furthermore, the representative example of "holes corresponding to protrusion" is that the position of the protrusion coincides with that of the hole and the cross-sectional plane of the protrusion plane are almost the same as the shape and size of the holes. However, the present invention is not limited to the above narrow concept, but includes a wider concept.

In the invention, since a hole corresponding to a protrusion formed on the attaching base member is formed, it is possible to easily carry out positioning and attaching of a conductive portion device by fitting the protrusion in the hole. That is, it is possible to easily attach a conductive portion device to an attaching base member at an appointed position thereof and to prevent the slipping thereof after the same is attached.

Furthermore, the invention is not limited to a conductive portion device which can be positioned in either direction (both X and Y directions) along the plane of a conductive thin film. For example, in a case where there is only one combination of the protrusion and hole and the cross-sectional shape and size of the hole and protrusion are not identical to each other, there is a case where the positioning thereof cannot be carried out in one direction (for example, X direction) even though the positioning is possible in the other direction (for example, Y direction). Furthermore, in a case where there is only one combination of the protrusion and hole and both the cross-sectional plane of the protrusion and shape of the hole are circular, there is a case where a positional slip may arise so as to rotate centering around the center of the protrusion and hole. Furthermore, in a case where the size of the cross-sectional plane of the protrusion is considerably larger than the size of the hole, there may be a case where a slight positional slip may arise. However, all of these are included in the invention. That is, the invention includes conductive portion devices for which at least a slight positioning can be carried out (is able to lessen the positional slip).

A fourth aspect of the invention is a conductive portion device as set forth in the third aspect thereof, wherein the protrusion and the hole are formed so that, when the conductive portion device is attached to the attaching base member, the conductive portion device can be positioned in either direction along the plane of the insulation film with respect to the attaching base member.

According to the fourth aspect, since the protrusion and hole are formed so as to be positioned in either direction along the insulation film, it is possible to more accurately obtain the effect of the third aspect of the invention.

For example, in a case where the cross-sectional plane of the protrusion are almost the same as the shape and size of the hole and there are two or more combinations of the protrusion and hole, it is possible to securely carry out the positioning in both X and Y directions. Furthermore, even though there is one combination of the protrusion and hole, it is possible to prevent rotations centering around the protrusion and hole when the cross-sectional plane of the protrusion is almost the same as the shape and size of the hole and the shape thereof is not circular.

A fifth aspect of the invention is a conductive portion device as set forth in the third or the fourth aspect of the invention, wherein the hole is formed between the adjacent conductive materials.

The term "to be formed between the adjacent conductive materials" includes not only a case where a hole is formed on only the insulation film between adjacent conductive materials, but also a case where a part of the hole extends to the corresponding adjacent conductive material, etc. As described with respect to the third aspect of the invention, this also includes a case where cutouts are formed at the points of the conductive materials opposite each other at the point where no insulation film exists and is able to act as a hole with its entirety.

In this invention, since a protrusion of the attaching base member is fitted in the hole formed between the adjacent conductive materials, the adjacent conductive materials can be prevented from being brought into contact with each other by the protrusion in addition to the operations and effects of the third or the fourth aspect of the invention, and by the protrusion being an insulation material, it is possible to prevent any short-circuit from occurring between both the conductive materials.

A sixth aspect of the invention is a conductive portion device as set forth in the first to the fifth aspects of the invention, wherein the ends of the conductive materials protrude in a direction of crossing the plane formed by the insulation film.

In this invention, in addition to the operations and effects according to the first to the fifth invention, an effect can be obtained, by which it is possible to easily connect electric circuit elements, etc. to the ends of the conductive materials by welding, etc.

A seventh aspect of the invention is a method for manufacturing a conductive portion device having a plurality of independent conductive portions, which comprises the steps of manufacturing a coupled conductive material having the plurality of conductive portions integrally coupled to each other at a coupling part, from a sheet-like conductive plate, attaching the coupled conductive material to an insulation film, and eliminating the coupling part of the coupled conductive material attached to the insulation film, thereby forming conductive materials which constitute the plurality of independent conductive portions.

In this invention, since the plurality of conductive materials are attached to an insulation film with a plurality of coupling materials coupled at coupling parts (in the form of a coupled conductive material) and thereafter the coupling parts are eliminated, it is possible to easily dispose the conductive materials at any appointed position with respect to the insulation film.

That is, since a plurality of conductive materials are integrally coupled to each other at the coupling parts from manufacture of conductive materials to be coupled to attaching thereof onto an insulation film, it is possible to easily manufacture a plurality of conductive materials with their relative positions held in any appointed state, and thereafter their relative positions will not be changed. Accordingly, since a plurality of independent conductive materials are able to be formed by eliminating the coupling parts after the coupled conductive materials are attached to the insulation film, even thereafter, the relative positions of a plurality of conductive materials are not changed by the insulation film.

Therefore, with the invention, it is possible to dispose conductive materials more efficiently than a case where conductive materials are disposed one by one on an insulation film, and it is possible to easily manufacture a conductive portion device described in the first aspect of the invention.

An eighth aspect of the invention is a method for manufacturing conductive portion device as set forth in the seventh aspect of the invention, wherein the coupling part is eliminated with a punch in the coupling part eliminating step.

In the invention, since the coupling parts are eliminated by a punch, it is possible to easily eliminate the coupling parts.

A ninth aspect of the invention is a method for manufacturing conductive portion devices as set forth in the eighth aspect of the invention, wherein the portions, of the insulation film, corresponding to the coupling part are eliminated in advance to be larger than the cross section of the punch.

Herein, the term "to be eliminated" may include that a hole is formed or a cutout part is formed.

In this invention, when eliminating the coupling parts of the coupled conductive material by using a punch, only the coupled conductive material is eliminated, and the elimination by a punch is not carried out on the insulation film. Therefore, the following effects can be obtained. That is, if the insulation film is eliminated in a case where an adhesive agent is coated on the rear side (the side of the coupled conductive material) of the insulation film, the adhesive agent oozes to the end face of the eliminated pieces thereof and the eliminated pieces may have adhesivity, so that they may be attached to the other members, and the working efficiency may be reduced. However, with the present invention, such an unfavorable occurrence can be prevented.

A tenth aspect of the invention is a method for manufacturing conductive portion device having a plurality of independent conductive portions, which comprises the steps of manufacturing a coupled conductive material having the plurality of conductive materials integrally coupled to each other at a coupling part, from a sheet-like conductive plate, thermally bonding a thermostatic insulation film at both the sides of the coupled conductive material, and eliminating the coupling part of the coupled conductive material to which the insulation film is thermally bonded, thereby forming conductive materials which constitute the plurality of independent conductive portions.

In this invention, since a thermoplastic insulation film is thermally bonded from both the sides of the coupled conductive material with a plurality of coupling materials coupled to each other at the coupling parts and thereafter the coupling parts are eliminated, it is possible to easily and efficiently dispose conductive materials at appointed relative positions and possible to manufacture a conductive portion device as set forth in the second aspect of the invention.

An eleventh aspect of the invention is the methods as set forth in the seventh to the tenth aspects of the invention, which is a method for manufacturing a conductive portion device to be attached to an attaching base member, wherein a hole corresponding to a protrusion formed on the attaching base member is formed by eliminating the coupling part in the coupling part eliminating step.

Furthermore, in a case where there are a plurality of coupling parts and the plurality of coupling parts are eliminated, all of the coupling parts are not necessarily such that a hole corresponding to the protrusion of the attaching base member is formed.

With the invention, since it is possible to form a hole corresponding to the protrusion of the attaching base member simultaneously with eliminating the coupling parts of the coupled conductive materials, it is not necessary to form the corresponding holes in another different step, and it is possible to easily manufacture conductive portion devices as set forth in the third aspect of the invention.

BEST MODES FOR CARRYING OUT THE INVENTION

[Embodiment 1]

Next, a description is given of a first preferred embodiment of the invention with reference to FIGS. 1 to 6.

Figure 1:
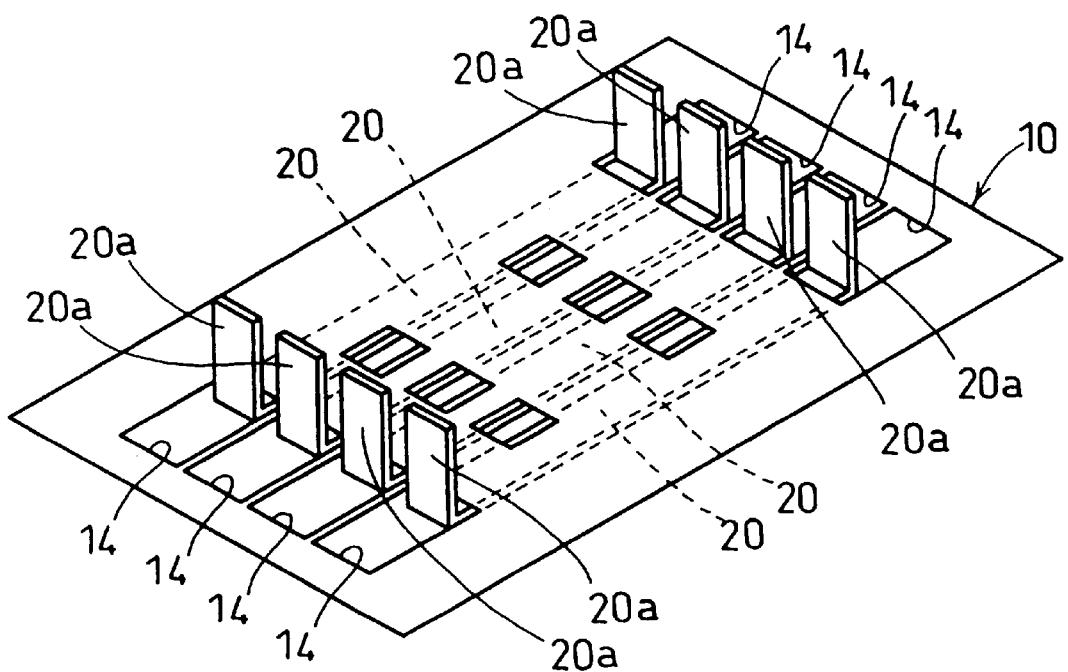
FIG. 1 is a perspective view showing a conductive portion device according to a first preferred embodiment of the invention with the thickness of film omitted. Also, the film thickness is omitted in other drawings except FIG. 6 and FIG. 14.

As illustrated in FIG. 1, the conductive portion device is formed by adhering four conductive materials 20 to the rear side of a film (insulation film) 10.

The film 10 is made of polyester or polyphenyl sulfite and has insulating property. The thickness of the film is 0.03 mm to 0.5 mm or the like. Four holes 14 are formed at both the ends of the film 10.

Conductive materials (conductive portions) 20 are made of conductive metal and are of band-like shape so as to have a narrow width. Each conductive material 20 is disposed to be parallel to each other in proximity with a small clearance provided therebetween and is adhered to the rear side of the film 10 by an adhesive agent. Resin-oriented, silicone-oriented, or rubber-oriented adhesive agent may be employed.

Both the ends of each conductive material 20 are folded upward at right angles, thereby forming connection ends 20a, and the respective connection ends 20a are protruded upward through the hole 14. The respective connection ends 20a are such that an electric circuit element such as a capacitor is electrically welded for connection.

Next, a description is given of a way of using the conductive portion device and the operation and effects thereof.

Since in the conductive portion device, each conductive material 20 is adhered to the film 10 in advance, an appointed wiring can be formed by incorporating the conductive portion device in an electric circuit substrate, etc. That is, in comparison with a case where conductive materials 20 (electric wires) are manually disposed one by one, electric wiring can be easily carried out, and it is very convenient and advantageous. Furthermore, since each conductive material 20 is adhered to the film 10, the entire substrate will not become thick, and space saving can be achieved.

Furthermore, since the connection ends 20a of the respective conductive material are folded to constitute a right angle, it is possible to easily connect electric circuits such as a capacitor to these connection ends 20a by electric welding.

Next, a description is given of a method for manufacturing the conductive portion device.

A sheet-like metal plate 30 and a sheet-like film are prepared. Resin-oriented, silicone-oriented or rubber-oriented adhesive agent is coated onto the rear side of the film (see FIGS. 2 and 3).

Figure 2:
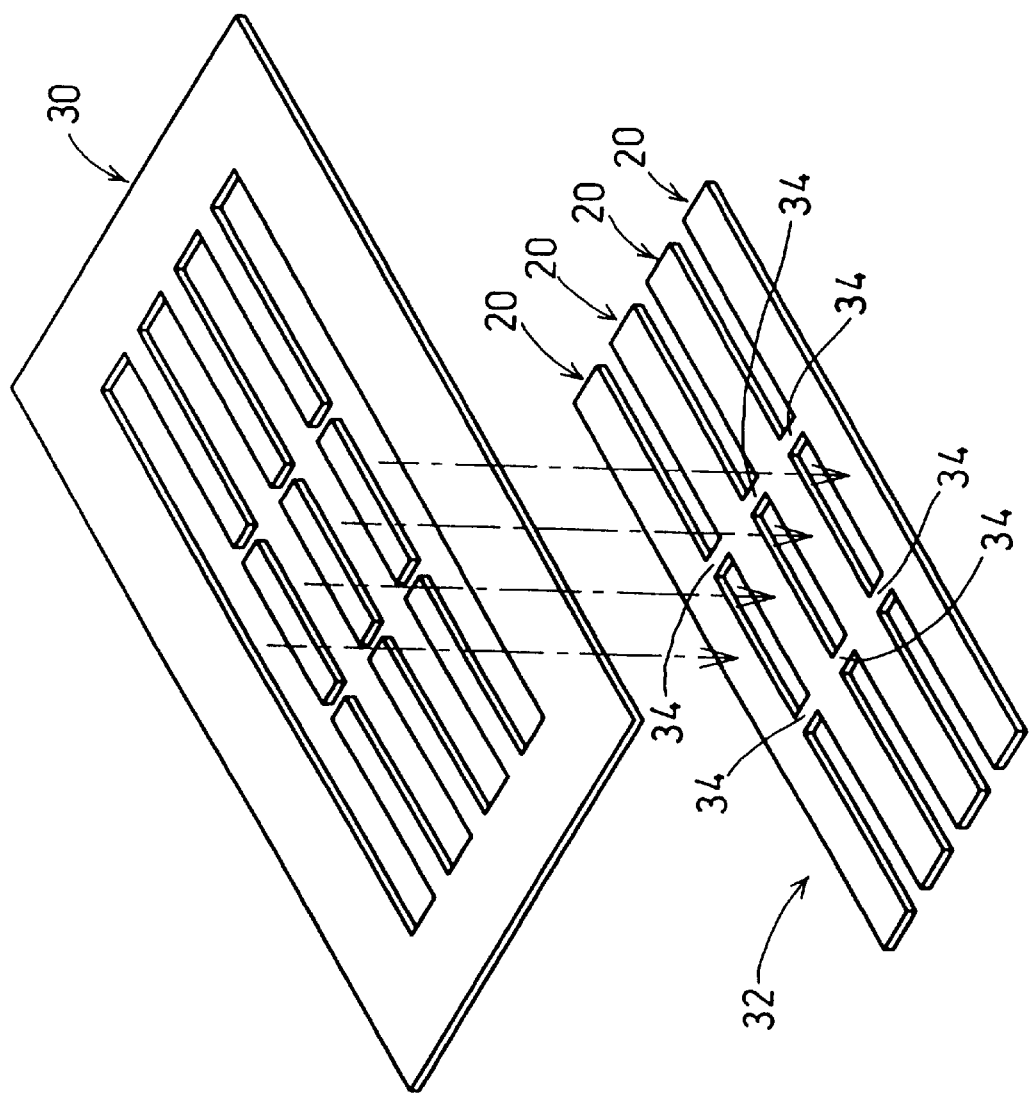
FIGS. 2 to 6 are perspective views showing a process of manufacturing the conductive portion device.

As illustrated in FIG. 2, a metallic plate 30 is die-cut to make a coupled conductive material 32. That is, the coupled conductive material 32 is constructed so that four conductive materials (conductive portions) 20 are coupled by coupling parts 34. The respective conductive materials 20 are at the above-mentioned relative positions. That is, the respective conductive materials 20 are parallel to each other and are close to each other. The coupling parts 34 are disposed two by two between the adjacent conductive materials 20. Furthermore, the quantity, etc. of coupling parts 34 is not limited to this.

Figure 3:
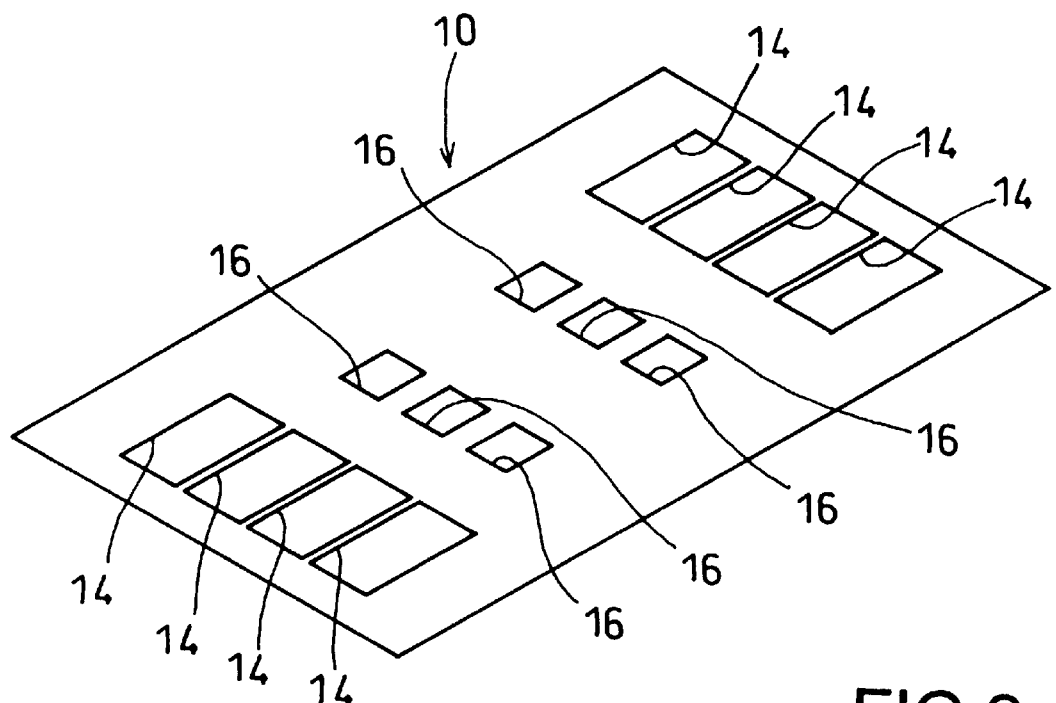

On the other hand, as shown in FIG. 3, holes 14 are formed on the film 10 by die-cutting. The holes 14 are formed at the position corresponding to both the ends of the respective conductive materials 20. Holes 16 for punching are formed on the film 10 by die-cutting. The holes 16 are formed at the positions corresponding to the respective coupling parts 34 of the coupled conductive material 32.

Figure 4:
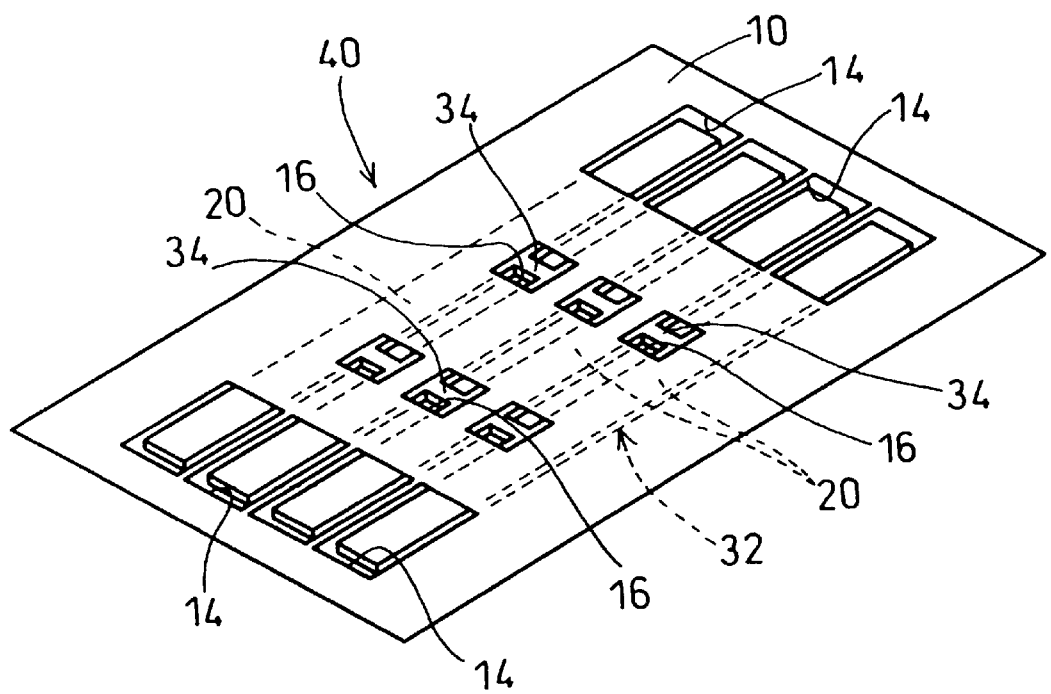

Next, as shown in FIG. 4, the coupled conductive material 32 is adhered to the rear side of the film 10 (hereinafter called film-attached coupled conductive plate 40).

Figure 5:
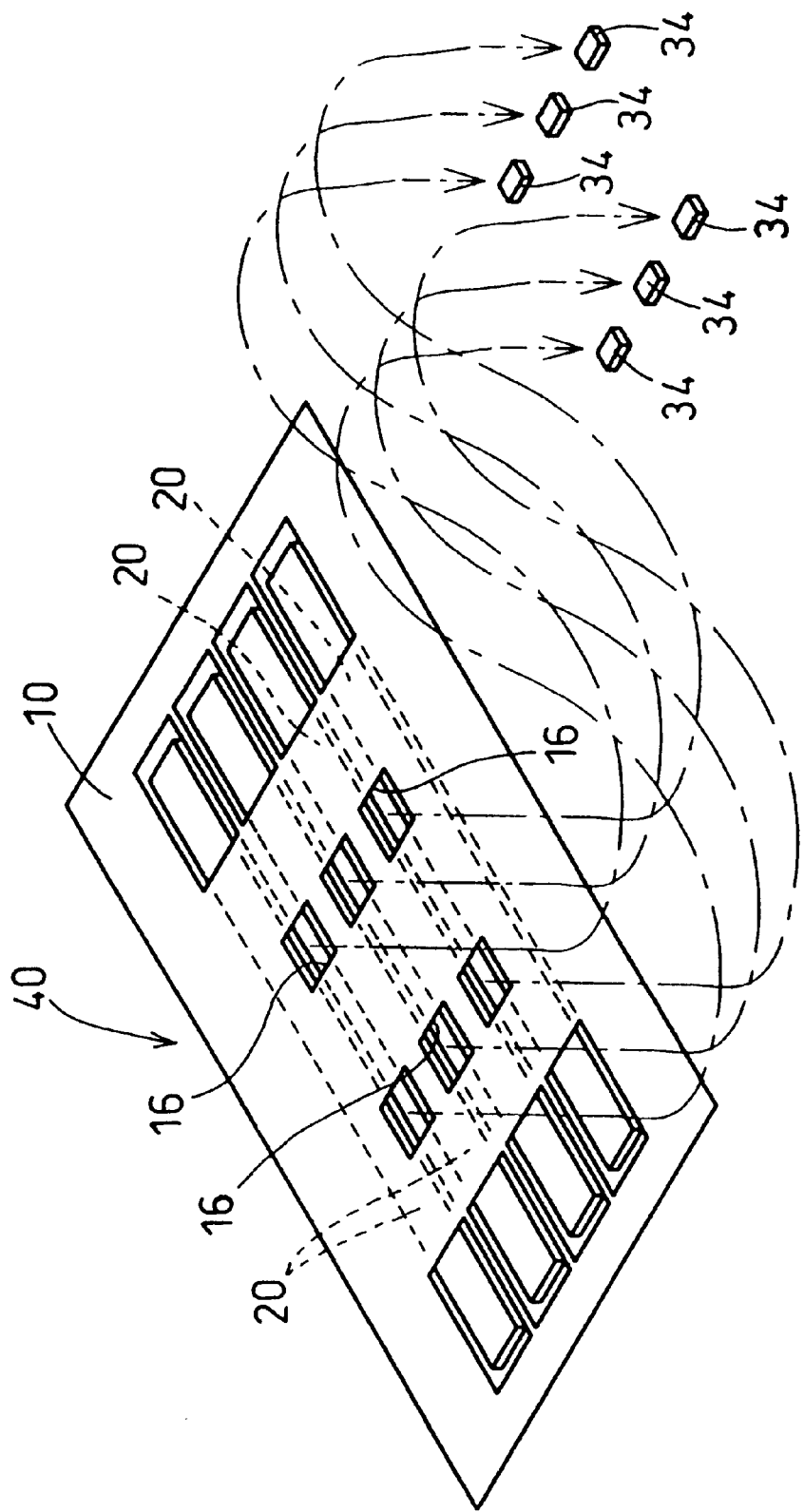

Next, as shown in FIG. 5, the coupling parts 34 of the film-attached coupled conductive material 40 are eliminated by a punching machine.

Figure 6:
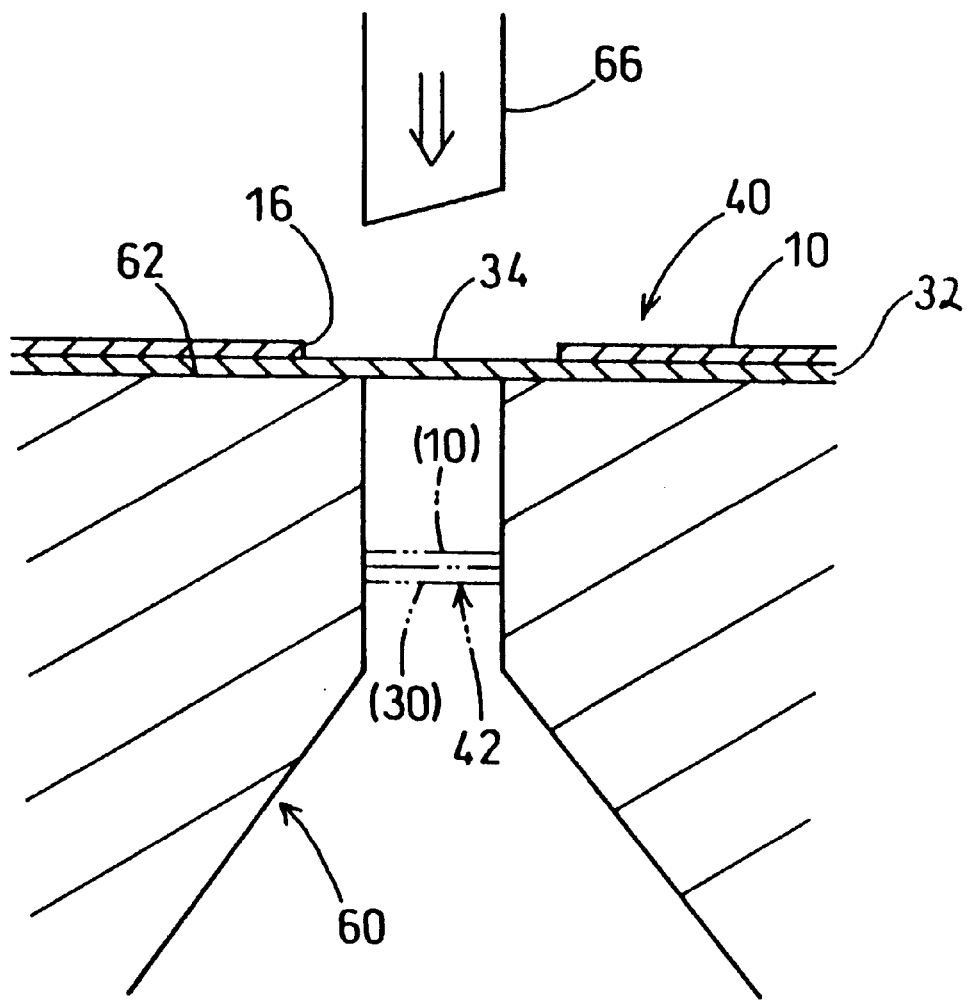

That is, as shown in FIG. 6, the film-attached coupled conductive material 40 is set on a placing plane 62 of a die 60 of the punching machine, and a punch 66 is brought down, thereby causing a die cutting to be performed. Furthermore, the holes 16 for punching are larger than the cross-section of the punch 66. With this arrangement, a punching can be performed at the coupling parts 34 of the coupled conductive material 32 without punching the film 10.

Thus, four independent conductive materials 20 (conductive portions) can be formed from the coupled conductive material 32.

Next, both the ends of the respective conductive materials 20 are folded upward at right angles to form connection ends 20a, wherein the connection ends 20a are caused to protrude upward through the respective holes 14 of the film 10.

As described above, a conductive portion device shown in FIG. 1 can be manufactured.

A description is given of the effects of this manufacturing method.

With the manufacturing method, when manufacturing a conductive portion device having four adjacent independent conductive materials 20, the conductive material 20 is adhered to the film 10 in the state of a coupled conductive material 32 composed by integrally coupling the conductive materials 20 at coupling parts 34.

Therefore, unlike a case where conductive materials 20 are manually adhered one by one to the film 10 or a case where electric materials 20 are directly disposed on an electric circuit substrate, conductive materials 20 can be easily disposed at desired relative positions.

That is, since the respective conductive materials 20 are coupled to each other by coupling parts 34 from manufacture of the coupled conductive materials 32 to adhesion to the film 10, the respective conductive materials 20 can be easily manufactured at desired relative positions, and after the manufacture is completed, their relative positions are never changed. Furthermore, since four independent conductive materials 20 can be formed by eliminating the coupling parts 34 after they are adhered to the film 10, the relative positions of the conductive materials 20 are never changed thereafter.

Thus, it is possible to easily manufacture the above-mentioned conductive portion device, and by disposing the conductive portion device, it is possible to dispose the four conductive materials 20 at desired relative positions.

Furthermore, in this manufacturing method, the coupling parts 34 of the coupled conductive materials 32 are eliminated by punching. Therefore, the elimination of the coupling parts 34 can be easily achieved.

The holes 16 are prepared beforehand at positions, of the film 10, corresponding to the coupling parts 34 of the coupled conductive material 32. Therefore, the film 10 is not punched by the punching machine when eliminating the coupling parts 34.

Accordingly, the following effects can be obtained. That is, as shown in FIG. 6, in a case where the punching holes 16 are not formed beforehand on the film 10, the film 10 is eliminated integrally and simultaneously with punching the coupling parts 34 of the coupled conductive material 32 (hereinafter called eliminated film pieces 42). At this time, the adhesive agent coated to the rear side of the eliminated film pieces 42 oozes from the sides (the thickness part) of the eliminated film pieces 42, and the eliminated film pieces 42 may adhere to the inside, etc. of the discharge opening 64 of the die 60 of the punching machine. Thus, the working efficiency of the punching may be worsened. However, with the above-mentioned manufacturing method, the film 10 is not punched when eliminating the coupling parts 34 and such a shortcoming does not occur.

[Embodiment 2]

Next, a description is given of a second preferred embodiment of the invention on the basis of FIGS. 7 to 13, centering around the difference from the first preferred embodiment.

Figure 7:
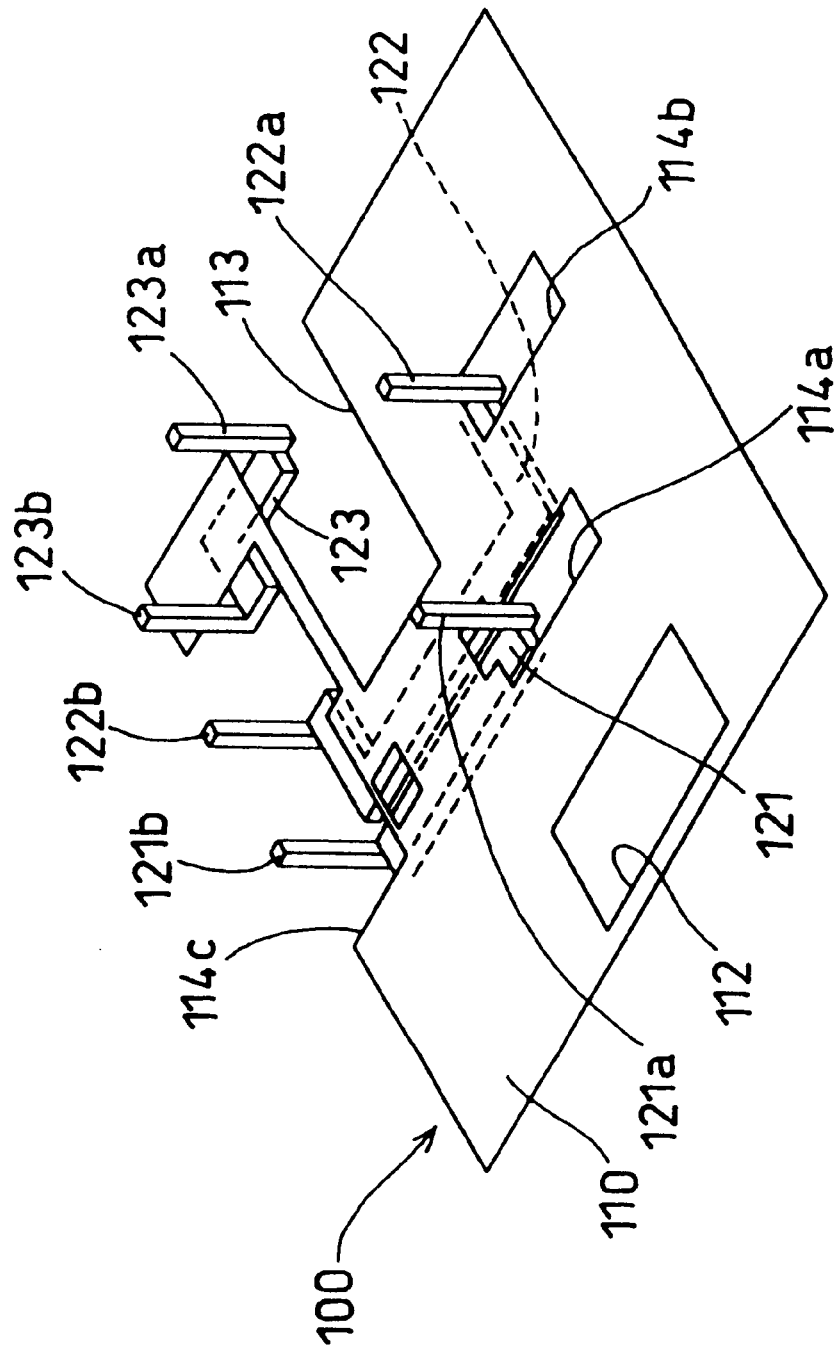
FIG. 7 is a perspective view showing a conductive portion device according to a second preferred embodiment of the invention.
Figure 8:
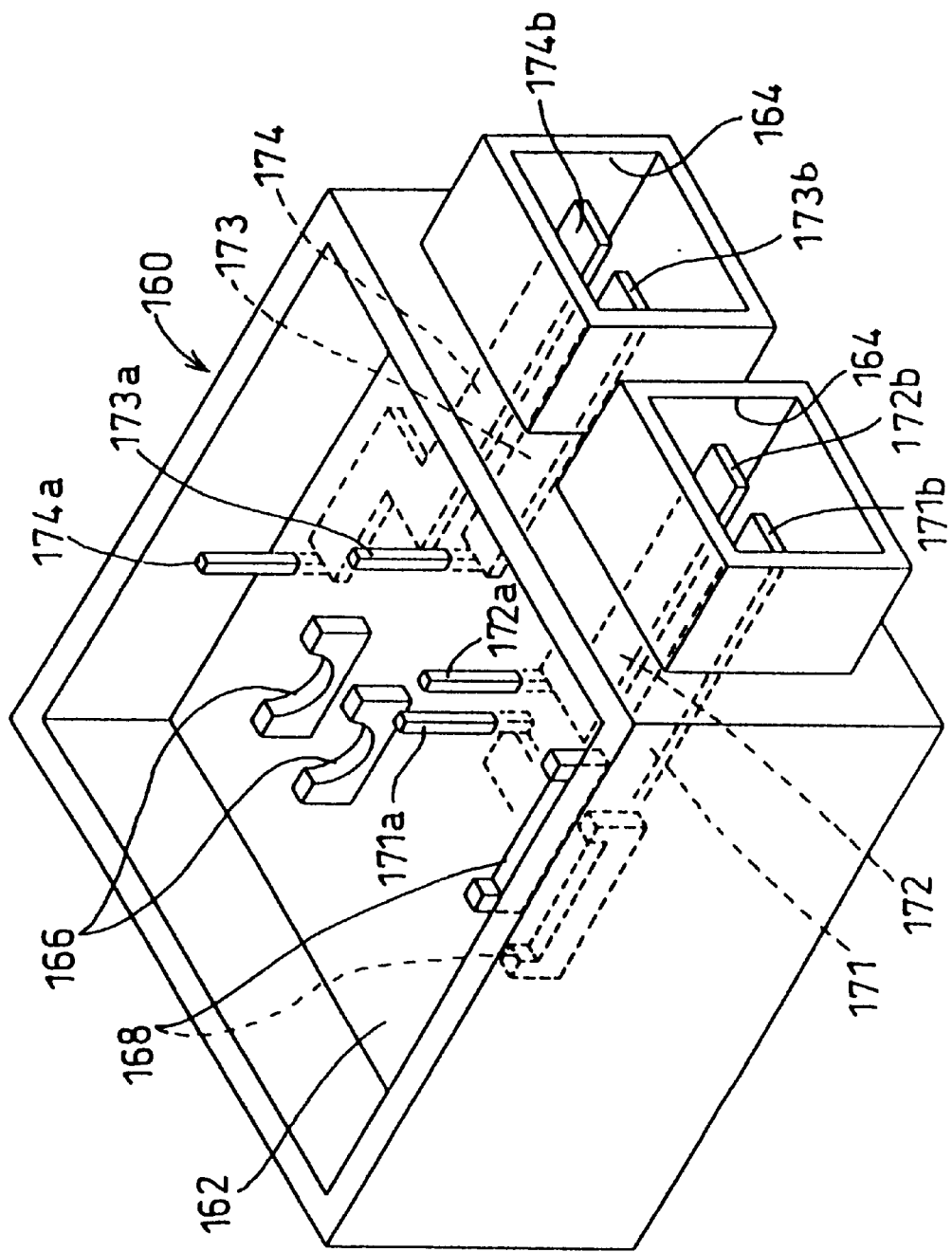
FIG. 8 is a perspective view showing an attaching base member to which the conductive portion device is attached.

The conductive portion device 100 (FIG. 7) can be attached to an attaching base member 160 (FIG. 8)

As shown in FIG. 8, the attaching base member 160 is formed of synthetic resin and is of vessel-like shape. The attaching base member 160 has a bottom plate 162 which is lifted from the usual bottom, and two connection ports 164 are provided at one side face of the attaching base member 160, wherein each of the connection ports 164 is communicated with the rear side of the bottom plate 162.

Four connecting members (first to fourth connecting members 171 to 174) made of metal is attached to the rear side of the bottom plate 162. The tip ends of the respective connecting members 171 to 174 are connection ends 171a to 174a while the respective connection ends 171a to 174a are protruded toward the surface side of the bottom plate 162 through holes secured at the bottom plate 162. The base ends of the respective connecting members 171 to 174 are connection parts 171b to 174b. The connection parts 171b to 174b are accommodated two by two in each of the connection ports 164.

Furthermore, transistor attaching portions 166 and a capacitor attaching portion 168 are formed on the bottom of the attaching base member 160.

As shown in FIG. 7, in this conductive portion device 100, three conductive materials (conductive portions) consisting of a first conductive material 121, a second conductive material 122 and a third conductive material 123 which are formed and adhered to the rear side of the film 110 as in the conductive portion device according to the first preferred embodiment.

Holes 112, 114a and 114b and cutout parts 114c and 113 are formed on the film 110.

The respective conductive materials 121 to 123 are made of metal having a conductive property and are made to be like a band having a narrow width while both the ends thereof are made further narrow and folded at right angles, thereby forming the connection ends 121a, 121b, 122a, 122b, 123a and 123b.

Accordingly, the respective connection ends 121a and 121b of the first conductive material 121 are protruded upward through the hole 114a and the cutout part 114c. The respective connection ends 122a and 122b of the second conductive material 122 are protruded upward through the hole 114b and the cutout part 114c. The respective connection ends 123a and 123b of the third conductive material 123 are protruded upward through the cutout part 113 and the cutout part 114c.

Next, the method of using this conductive portion device 100 is described below.

Figure 9:
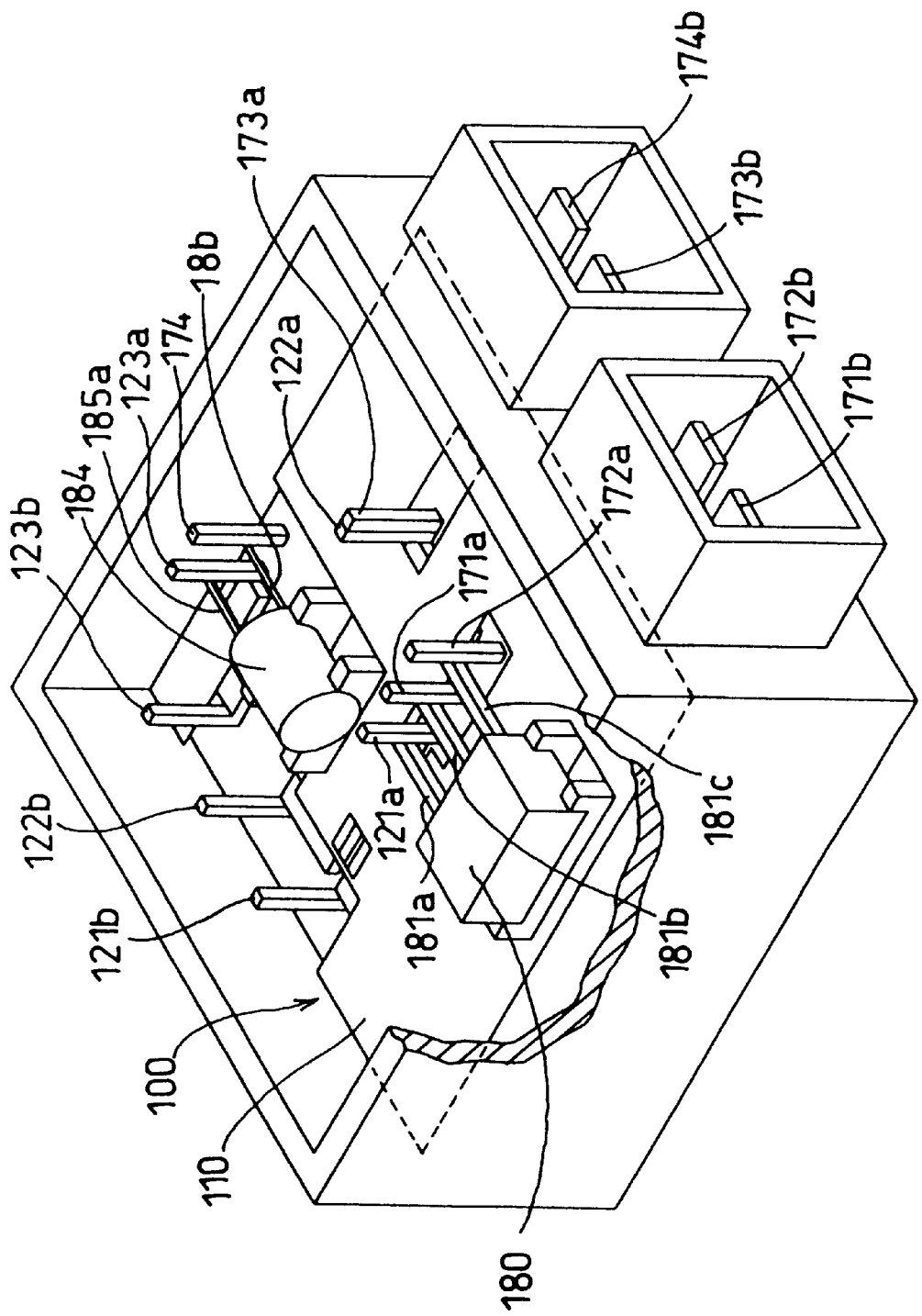
FIG. 9 is a perspective view showing a state where the conductive portion device is attached to its attaching base member.

As shown in FIG. 9, the conductive portion device 100 is attached to the bottom plate 162 of the attaching base member 160. A transistor 180 is attached to the transistor attaching part 166 of the attaching base member 160 through a hole 112 of the conductive portion device 100 while a capacitor 184 is attached to the capacitor attaching part 168 of the attaching base member 160 through the hole 113 of the conductive portion device 100.

Thus, the respective terminals 181a, 181b and 181c of the transistor 180 are brought into contact with the connection end 121a of the first conductive member 121, the connection end 171a of the first connecting member 181 and the connection end 172a of the second connecting member 172, and they are welded to be jointed.

Furthermore, the respective terminals 185a and 185b of the capacitor 184 are brought into contact with the connection end 123a of the third conductive material 123 and the connection end 174a of the fourth connecting member 174 and welded to be jointed to each other. Furthermore, the connection end 122a of the second conductive material 122 is brought into contact with the connection end 173a of the third connecting member 173 and welded to be jointed to each other.

Furthermore, as necessary, there may be cases where other electric circuit elements are incorporated or other conductive portion device 100 is arranged to overlap thereon. In these cases, connections may be performed on the connection ends 121b, 122b and 123b of the conductive materials 121, 122 and 123 and the connection ends 172a and 174a of the second and fourth connecting members 172 and 174, which are not used for the above-mentioned connections.

Thus, as in the first preferred embodiment, according to the conductive portion device 100, since the first to third conductive materials 121, 122 and 123 are adhered beforehand to the film 110, appointed wiring can be achieved by attaching this conductive portion device 100 onto the attaching base member 160, and the operation is performed much easier in comparison with a case where conductive materials (electric wires) are manually disposed one by one.

Next, a description is given of a method for manufacturing the conductive portion device 100.

A sheet-like metallic plate 130 and a sheet-like film 110 are prepared, and an adhesive agent is coated on the rear side of the sheet.

Figure 10:
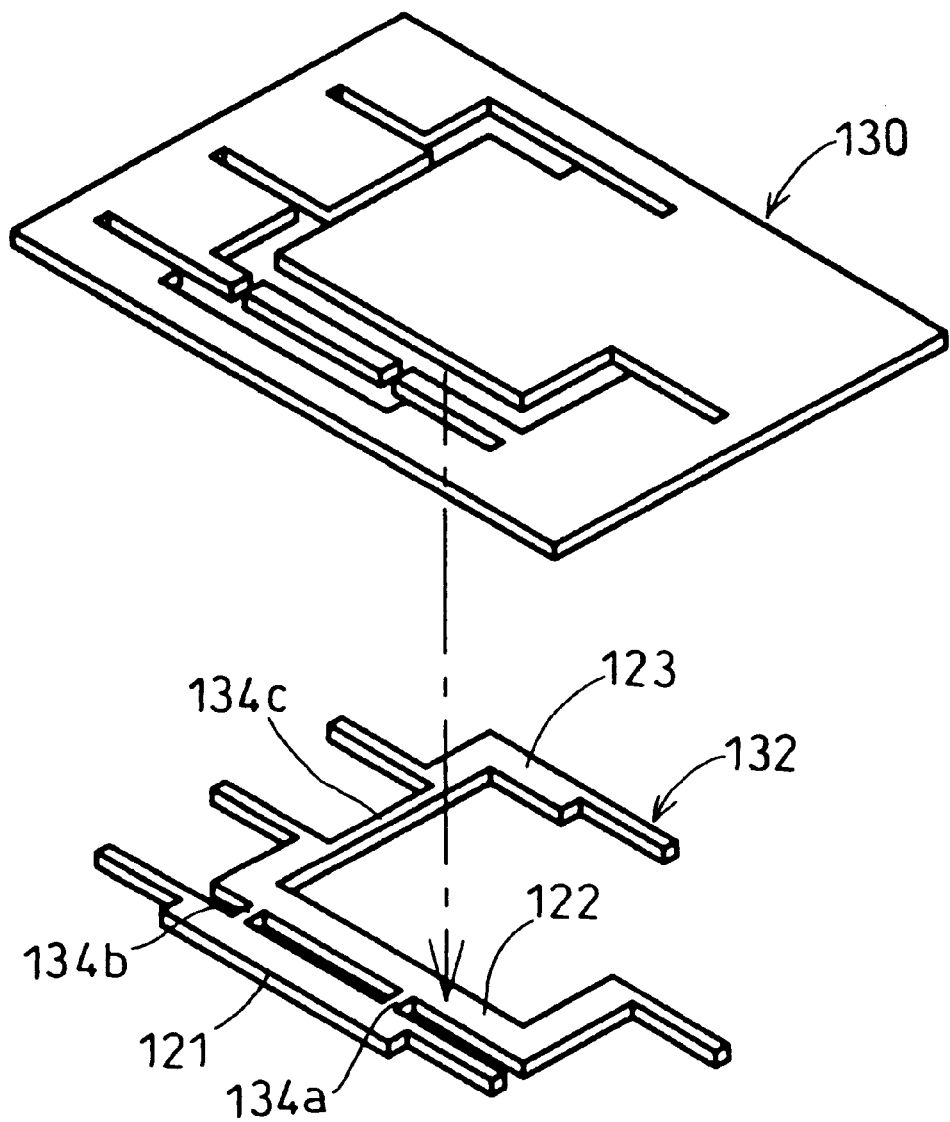
FIGS. 10 to 13 are perspective views showing a process of manufacturing the conductive portion device.

As shown in FIG. 10, a coupled conductive material 132 is manufactured by die cutting the metallic plate 130. The coupled conductive material 132 is such that three conductive materials (conductive portions) 121, 122 and 123 are coupled to each other by coupling parts 134a, 134b and 134c.

Figure 11:
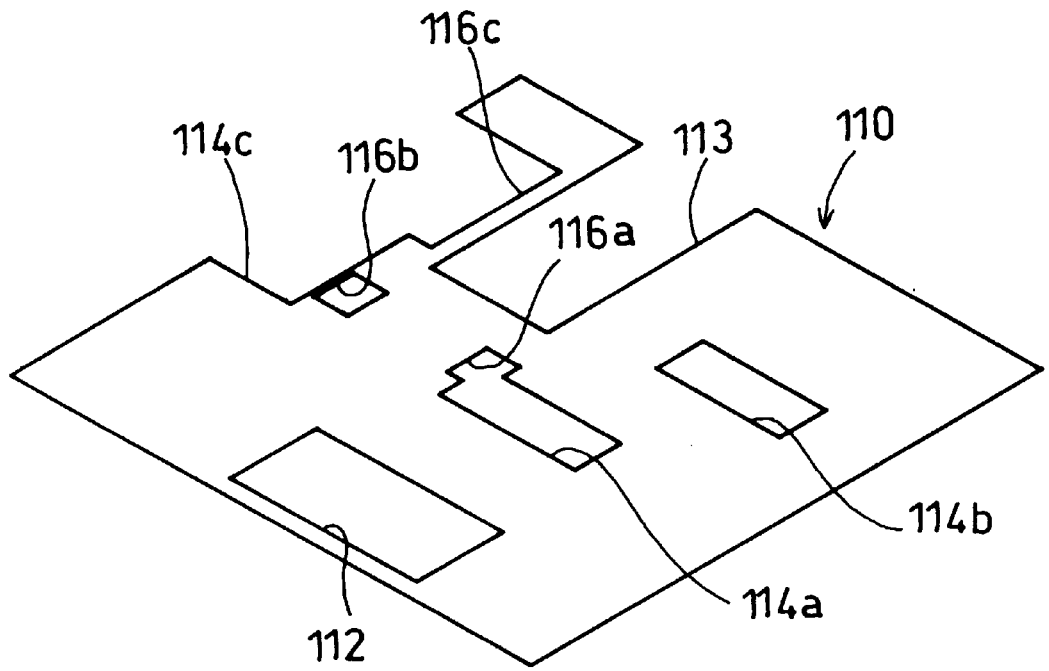

On the other hand, as shown in FIG. 11, holes 112, 114a and 114b and cutout parts 114c and 113 are formed on the film 110.

Similarly, a punching hole 116b is formed. Furthermore, the above-mentioned hole 114a includes a punching hole 116a, and the cutout part 114c includes a punching cutout part 116c.

Figure 12:
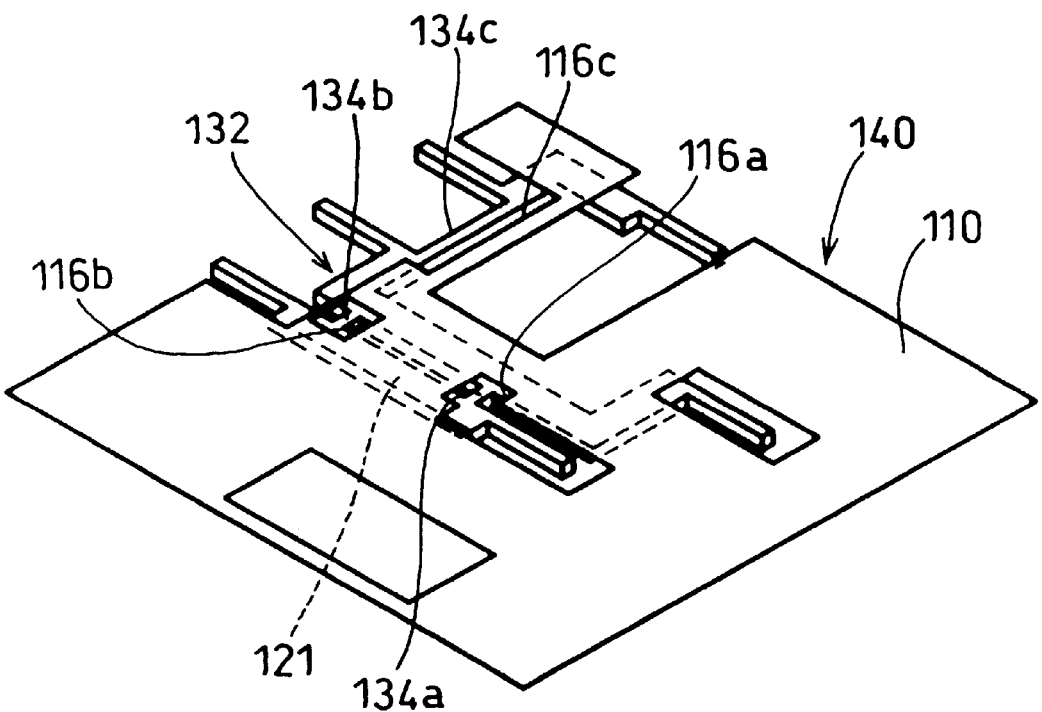

Next, as shown in FIG. 12, the coupled conductive material 132 is adhered to the rear side of the film 110 (hereinafter called film-attached coupled conductive material 140).

Figure 13:
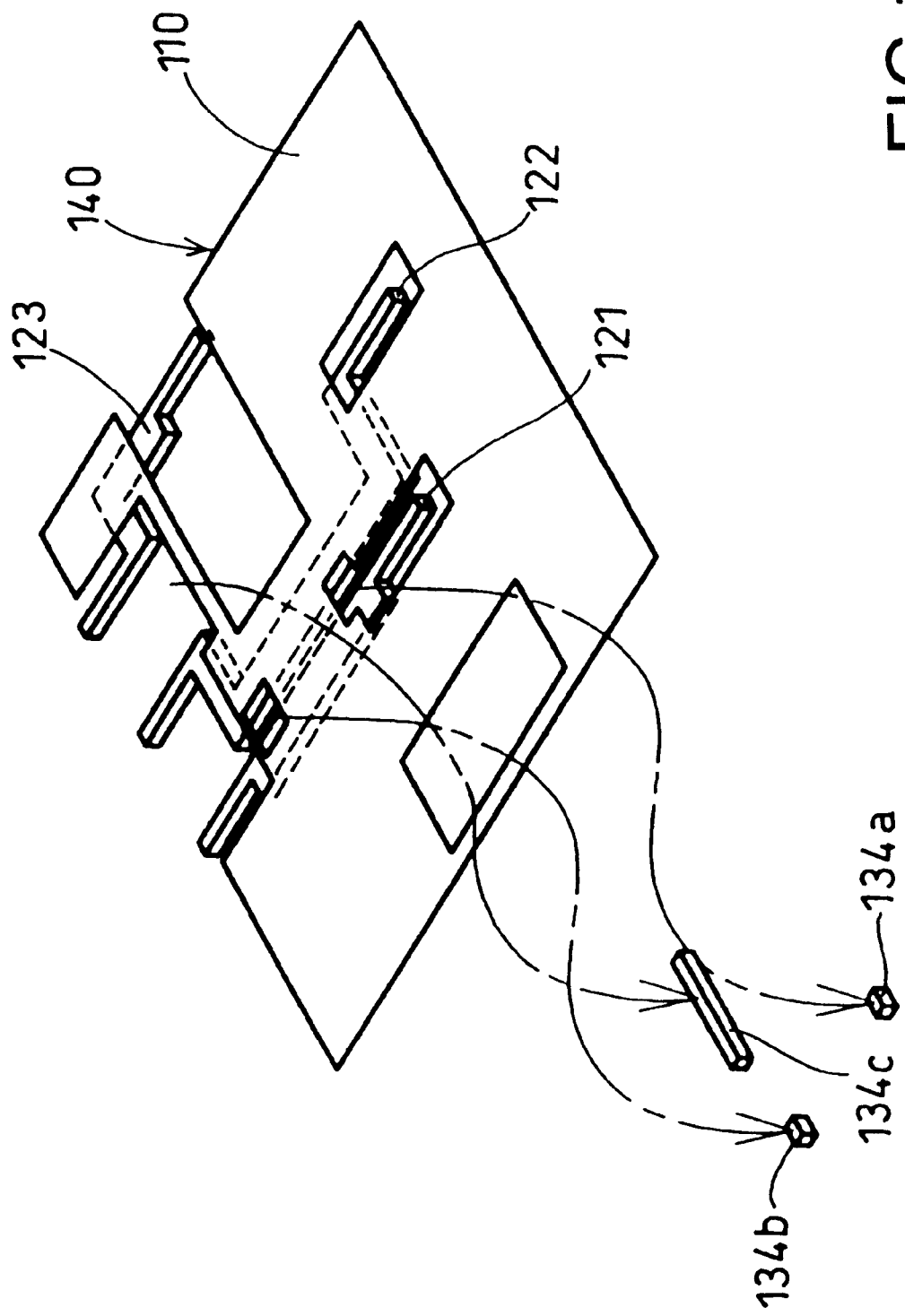

Next, as shown in FIG. 13, the coupling parts 134a, 134b and 134c are eliminated from the film-attached coupled conductive material 140 by punching with a punching machine. At this time, the punching is carried out through the punching holes 116a and 116b and the punching cutout part 116c. Therefore, it is possible to eliminate only the coupling parts of the coupled conductive material 132 without punching the film 110. Thus, three conductive materials consisting of the first to third conductive materials 121, 122 and 123 are formed of the coupled conductive material 132.

Next, both the ends of the respective conductive materials 121, 122 and 123 are folded upward at right angles, thereby forming the connection ends 121a, 121b, 122a, 122b, 123a and 123b, and they are protruded through the holes 114a and 114b, the cutout parts 114c and 113 of the film 110.

As described above, the conductive portion device 100 illustrated in FIG. 7 is manufactured.

With this manufacturing method, the same effects as those of the manufacturing method according to the first preferred embodiment can be obtained.

[Embodiment 3]

Figure 14:
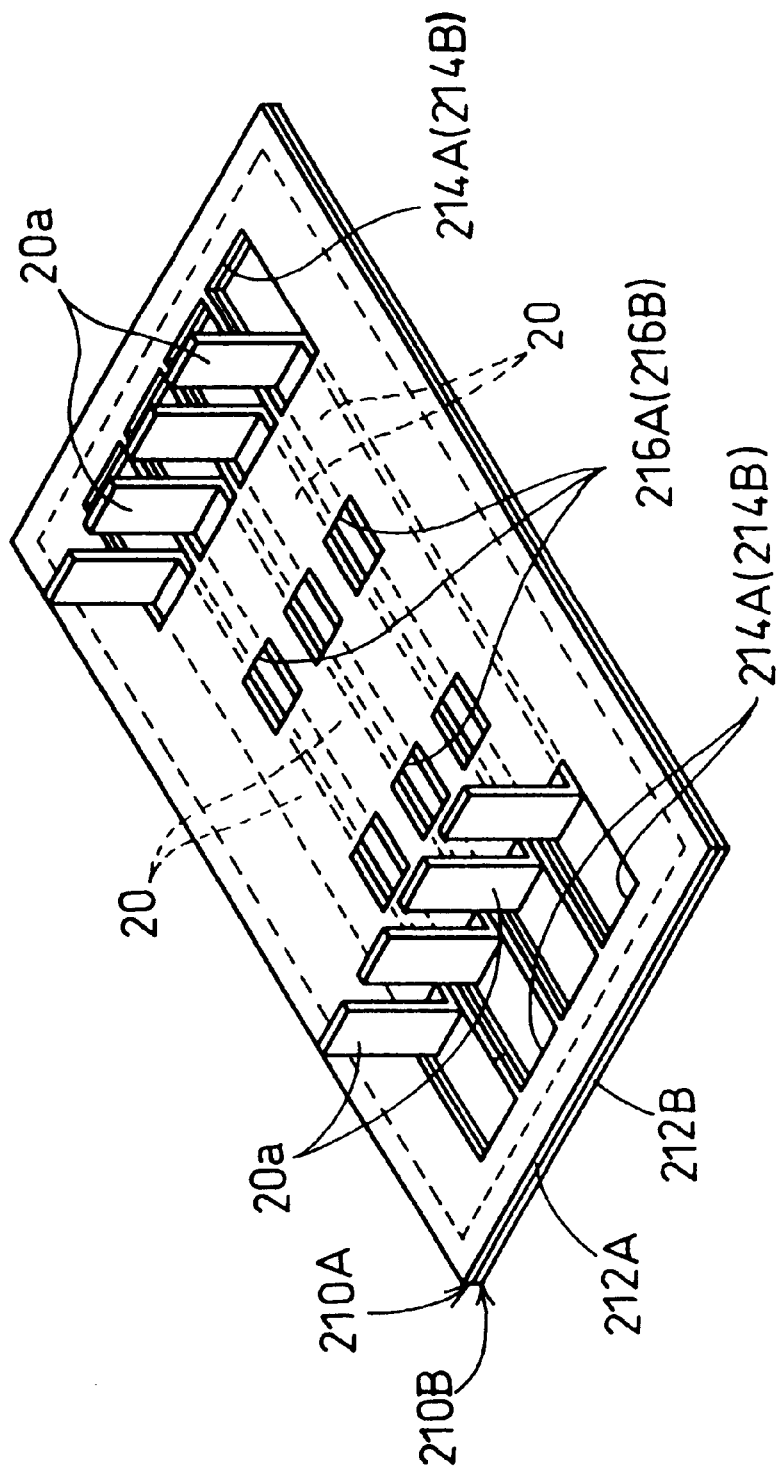
FIG. 14 is a perspective view showing a third preferred embodiment of the invention, wherein the thickness of both films is expressed in exaggeration.
Figure 15:
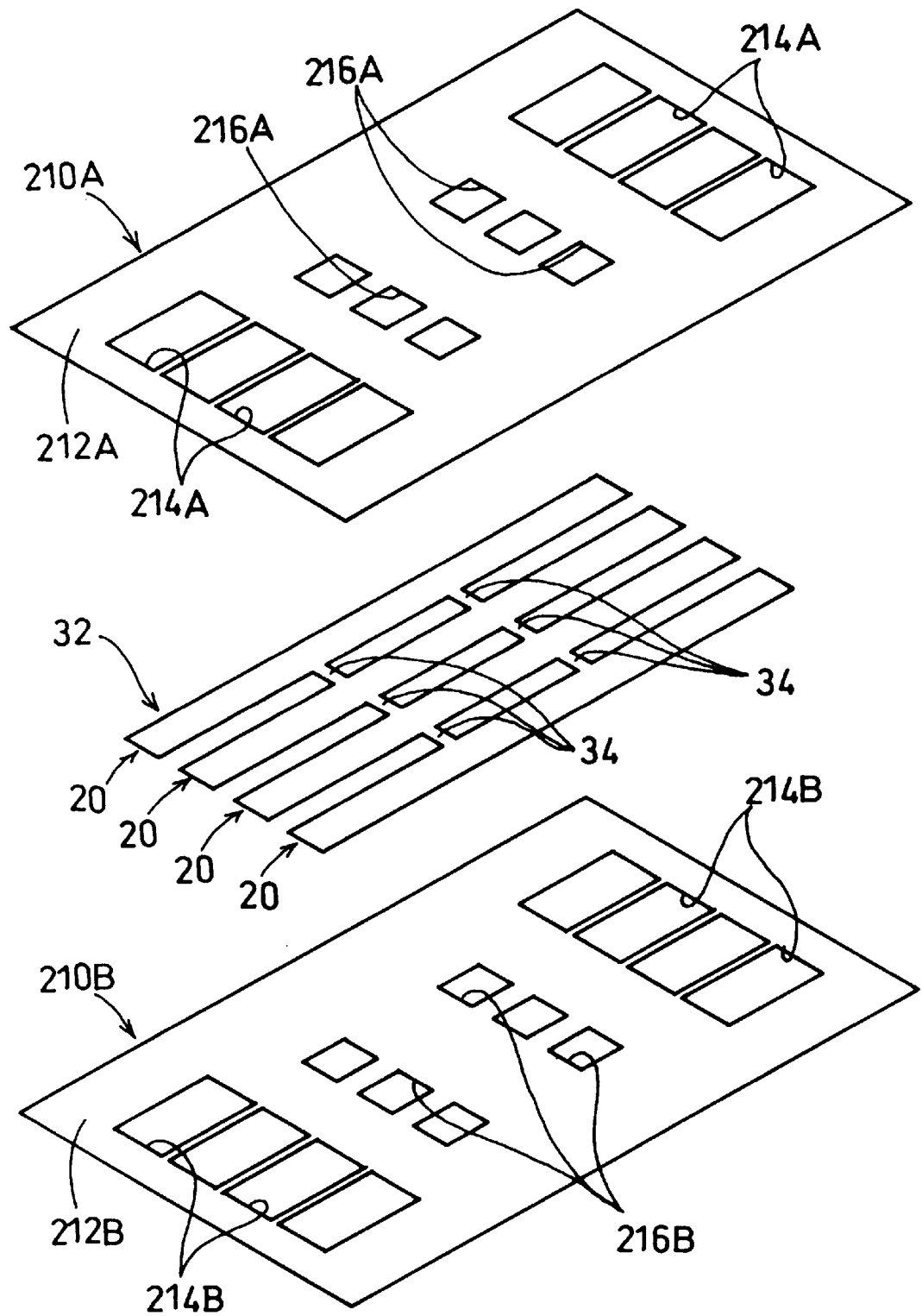
FIG. 15 is a perspective view showing one step of manufacturing the conductive portion device.

Next, a description is given of a third preferred embodiment of the invention on the basis of FIGS. 14 and 15, centering around the points which are different from the first preferred embodiment.

As shown in FIG. 14, the conductive portion device is such that films 210A and 210B are disposed on both of four conductive materials (conductive portions) disposed on one plane. The entire circumferential edges 212A and 212B of the films 210A and 210B are thermally bonded to be jointed to each other. Both the films 210A and 210B are thermoplastic.

Holes 212A and 213B are formed on both the films 210A and 210B, and both the ends of the respective conductive materials 20 are folded upward at right angles through the holes 212A and 212B, thereby forming the connection ends 20a.

As in the first preferred embodiment, an appointed wiring can be achieved by attaching this conductive portion device to an appointed electric circuit substrate.

Furthermore, since both the sides of the conductive material 20 is covered up by films 210A and 210B in this conductive portion device, the following effects can be produced, in comparison with a case where a film is attached to only one side thereof (the film having an adhesive agent coated on its rear side).

That is, in a case where a film having an adhesive agent coated on its rear side is attached to one side of the conductive material 20, the layer of the adhesive agent is exposed at the part, of the rear side of the film, where no conductive material 20 is attached, and the part is adhesive. Therefore, when incorporating elements there, the part may be adhered to members other than the members to be incorporated. However, this conductive portion device does ii not have any adhesivity on both its sides, such a shortcoming can be prevented from occurring.

Next, a description is given of a method for manufacturing the conductive portion device.

A sheet-like metallic plate and two films 210A and 210B are prepared. As in the first preferred embodiment, a coupled conductive material 32 is produced by die cutting the metallic plate. The coupled conductive material is such that four conductive materials (conductive portions) 20 are coupled to each other by coupling parts 34.

On the other hand, holes 214A and 214B and punching holes 216A and 216B are formed by die-cutting on both films 210A and 210B. The holes 214A and 214B are formed at the positions corresponding to both ends of the respective conductive materials 20. The punching holes 216A and 216B are formed at the positions corresponding to the respective coupling parts 34 of the coupled conductive material 32.

Next, the coupled conductive material 32 is put between both the films 210A and 210B, and the edges 212A and 212B of the entire circumference are thermally bonded to be jointed.

Next, the coupling parts 34 of the coupled conductive material 32 are eliminated by punching with a punching machine, thereby obtaining four conductive materials 20.

Next, both the ends of the respective conductive materials 20 are folded upward through the hole 214A of the film 210A in order to form connection ends 20a.

As described above, the conductive portion device shown in FIG. 14 is produced. By this manufacturing method, the effects as those of the manufacturing method of the first preferred embodiment can be obtained.

[Embodiment 4]

Next, a description is given of a fourth preferred embodiment of the invention on the basis of FIGS. 16 to 20, centering around the points which are different from the first preferred embodiment.

Figure 16:
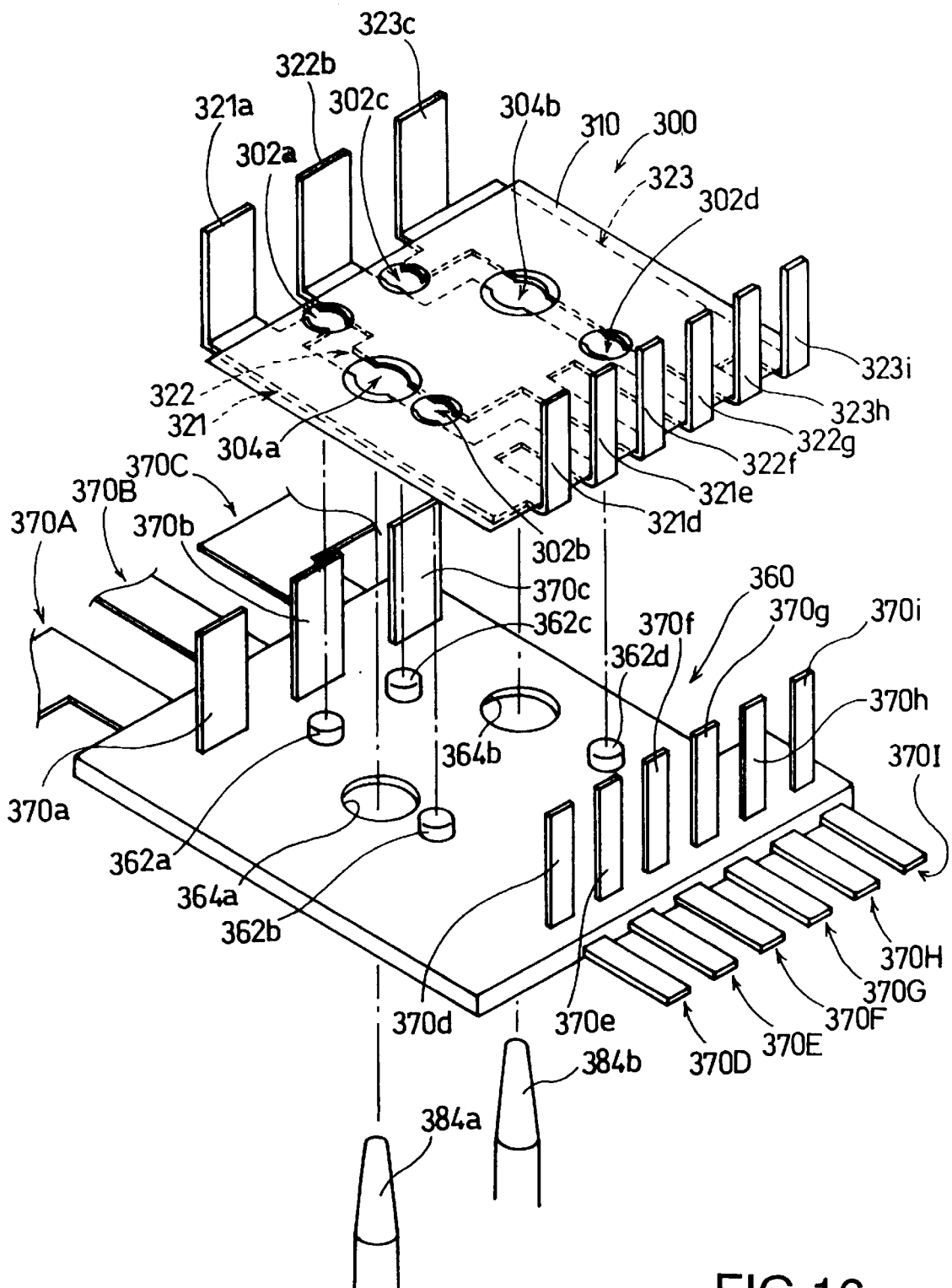
FIG. 16 is a perspective view showing a conductive portion device of a fourth preferred embodiment of the invention and an attaching base member to which the conductive portion device is attached.

As shown in FIG. 16, a conductive portion device 300 is attached to an attaching base member 360.

The attaching base member 360 is made of synthetic resin and is of plate-like shape. Nine connecting members (the first to the ninth connecting members 370A to 370I) made of metal are attached to the attaching base member 360 so as to be embedded therein. The tip ends of the respective connecting members 370A to 370I are connection ends 370a to 370i, which protrude on the surface side of the attaching base member 360 at right angles.

Four positioning protrusions 362a to 362d are formed at the attaching base member 360. The respective protrusions 362a to 362d are of substantially column-like shape.

Furthermore, the shape of the respective protrusions 362a to 362d is not limited to the column-like shape. For example, the shape may be substantially conical, semi-spherical, etc.

Two holes 364a and 364b are formed on the attaching base member 360. These holes 364a and 364b are formed in correspondence to bosses 384a and 384b (described later).

The conductive portion device 300 is formed by adhering three conductive materials (conductive portions) consisting of a first conductive material 321, a second conductive material 322 and a third conductive material 323, to the rear side of the film 310.

The respective conductive materials 321 to 323 are made of metal having conductivity and are like a band having a narrow width with each of the end sides branched into two to be bifurcated, and each of both ends is folded at right angles, thereby forming the connection ends 321a, 321d, 321e, 322b, 322f, 322g, 323c, 323h and 323i. The respective connection ends 321a, 321d, 321e, 322b, 322f, 322g, 323c, 323h and 323i correspond to the respective connection ends 370a to 370i of the attaching base member 360.

Accordingly, holes 302a to 302d are formed at the conductive portion device 300. Furthermore, preparatory holes 304a and 304b are also formed at the conductive portion device 300.

The respective holes 302a to 302d are formed to correspond to the respective protrusions 362a to 362d of the attaching base member 360. That is, the positions of the respective holes 302a to 302d correspond to (are coincident with) the position of the protrusions 362a to 362d of the attaching base member 360. Furthermore, the shape of the respective holes 302a to 302d is substantially the same as the cross-sectional shape of the protrusions 362a to 362d of the attaching base member 360, that is, the shape of the holes 302a to 302d and the cross section of the protrusions 362a to 362d are substantially circular, and the size of the respective holes 302a to 302d are substantially the same as the size of the cross section of the protrusions 362a to 362d of the attaching base member 360.

Figure 20:
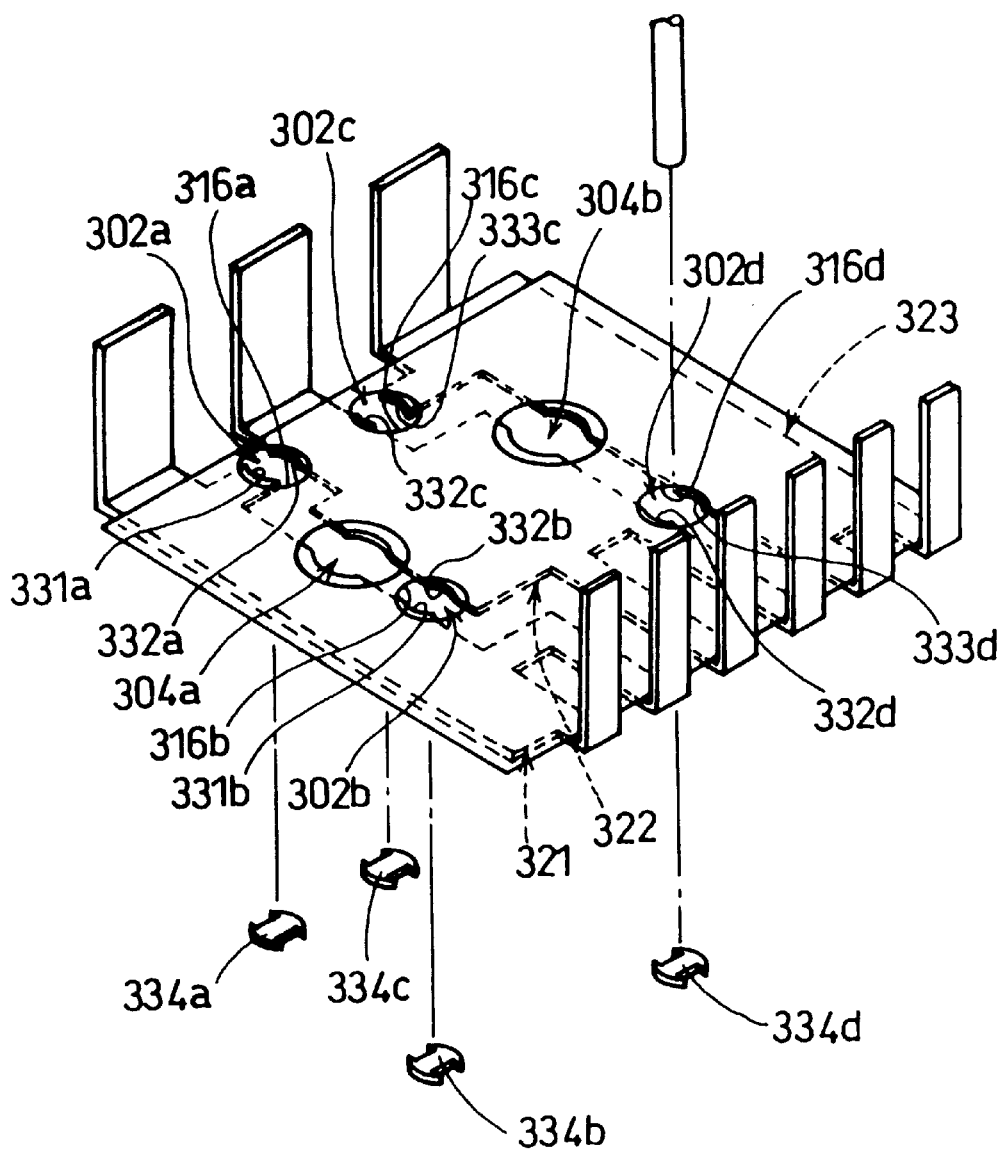

As shown in FIG. 20, the hole 302a is formed of a cutout part 331a formed at the first conductive material 321 and a cutout part 332a formed at the second conductive material 322. In other words, it can be said that the hole 302a is formed of the three elements consisting of both the cutout parts 331a and 332a, and a hole 316a of the film 310.

Similarly, the hole 302b is formed of a cutout part 331b of the first conductive material 321 and a cutout part 332b of the second conductive material 322 (and a hole 316b of the film 310). The hole 302c is formed of a cutout part 332c of the second conductive material 322 and a cutout part 333c of the third conductive material 323 (and a hole 316c of the film 310). The hole 302d is formed of a cutout part 332d of the second conductive material 322, a cutout part 333d of the third conductive material 323 (and a hole 316d of the film 310).

Furthermore, the preparatory holes 304a and 304b are formed so as to correspond to the respective holes 364a and 364b of the attaching base member 360. The hole 304a is formed of a cutout part 341a of the first conductive material 321 and a cutout part 342a of the second conductive material 322 (see FIG. 17)(and a hole 318a of the film 310 (see FIG. 18)). Similarly, the hole 304b is formed of a cutout part 342b of the second conductive material 322 and a cutout part 343b of the third conductive material 323 (and a hole 318b of the film 310).

Next, returning to FIG. 16, a description is given of a method of using this conductive portion device 300 and peculiar operations and effects thereof.

Firstly, the attaching base member 360 is set at an appointed position. At this time, the attaching base member 360 is set at an appointed position so that each of the bosses 384a and 384b is fitted into the respective holes 364a and 364b of the attaching base member 360. Both the bosses 384a and 384b are made erect at appointed positions and are used for positioning the attaching base member 360 and preparatorily positioning the conductive portion device 300 with respect to the attaching base member 360.

Next, each of the bosses 384a and 384b is caused to pass through the preparatorily positioning holes 304a and 304b of the conductive portion device 300, so that the conductive portion device 300 is roughly positioned preparatorily with respect to the attaching base member 360. Thereafter, the respective protrusions 362a to 362d of the attaching base member 360 are caused to be fitted into the holes 302a to 302d of the conductive portion device 300, thereby positioning the conductive portion device 300 with respect to the attaching base member 360.

Thus, it is possible to attach the conductive device 300 at an appointed position with respect to the attaching base member 360. Therefore, the respective connection ends 321a, 322b, 323c, 321d, 321e, 322f, 322g, 323h and 323i can be accurately brought into contact with the respective connection ends 370a to 370i of the attaching base member 360.

Furthermore, since the positioning protrusions 362a and 362b are located between the first conductive material 321 and the second conductive material 322, it is possible to shirk that the first conductive material 321 and the second conductive material 322 are brought into contact with each other due to a certain reason, and the first conductive material 321 can be prevented from being short-circuited to the second conductive material 322. Furthermore, since a plurality of positioning protrusions (362a and 362b) are located between the first conductive material 321 and the second conductive material 322, it is possible to further securely prevent them from being short-circuited, in comparison with a case where the number of protrusion is single. That is, in a case where any one or both of the conductive materials (321 and 322) causes a positional slip due to a certain reason, which turns so as to shirk the corresponding single positioning protrusion, there is a possibility that both the conductive materials 321 and 322 may be brought into contact with each other. However, in a case where the number of the protrusions is plural, such a possibility can be avoided. Furthermore, similarly, it is possible to prevent the second conductive material 322 and the third conductive material 323 from being short-circuited by the positioning protrusions 362c and 362d.

Furthermore, when attaching to another device the assembly which is comprised of the attaching base member 360 and the conductive portion device 300, by passing the bosses which are similar to the bosses 484a and 484b and which are formed at the another device through the holes 364a and 364b of the attaching base member 360 and the holes 304a and 304b of the conductive portion device 300, the assembly itself can be easily attached to the another device at an appointed position.

Next, a description is given of the method for manufacturing the conductive portion device 300.

A sheet-like metallic plate (see FIG. 17) and a sheet-like film (see FIG. 18) are prepared, and an adhesive agent is coated onto the rear side of the film.

Figure 17:
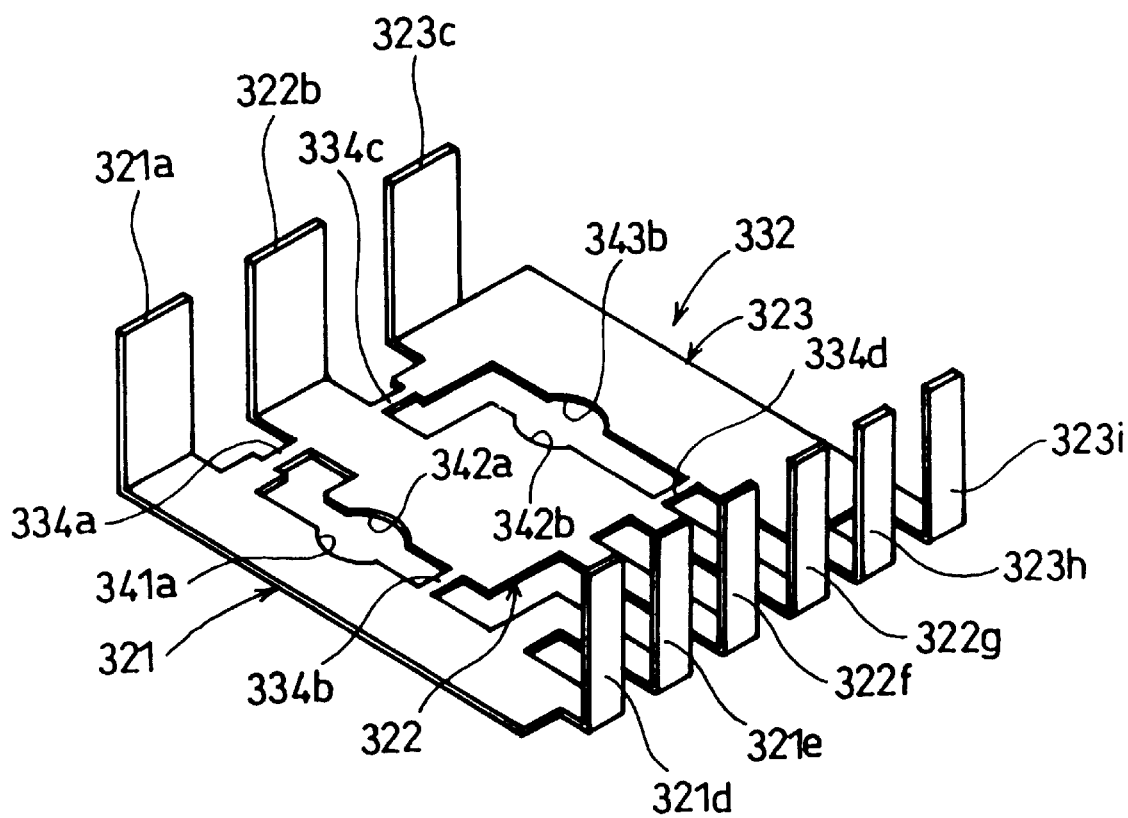
FIGS. 17 to 20 are perspective views showing a process of manufacturing the conductive portion device.

As shown in FIG. 17, a coupled conductive material 332 is produced by die-cutting the metallic plate. The coupled conductive material 332 is shaped so that three conductive materials (conductive portions) 321, 322 and 323 are coupled to each other by coupling parts 334a to 334d. Cutout parts 341a, 342a, 342b and 343b are formed at the coupled conductive material 332. Furthermore, connection ends 321a, 322b, 323c, 321d, 321e, 322f, 322g, 323h and 323i are formed on the coupled conductive material 332.

Figure 18:
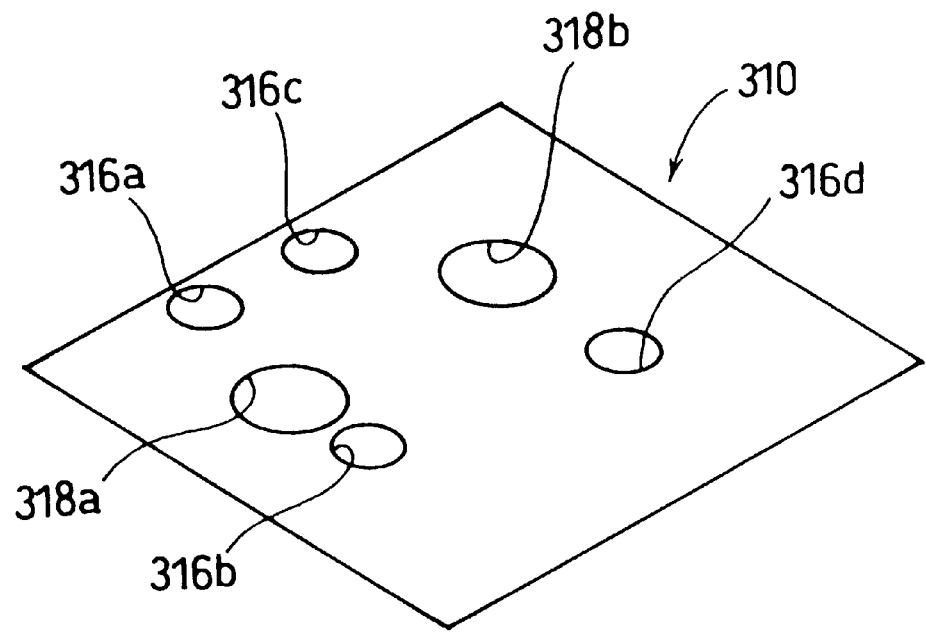

On the other hand, as shown in FIG. 18, holes 316a to 316d, and holes 318a and 318b are formed at the film 310 by die-cutting the film 310.

Figure 19:
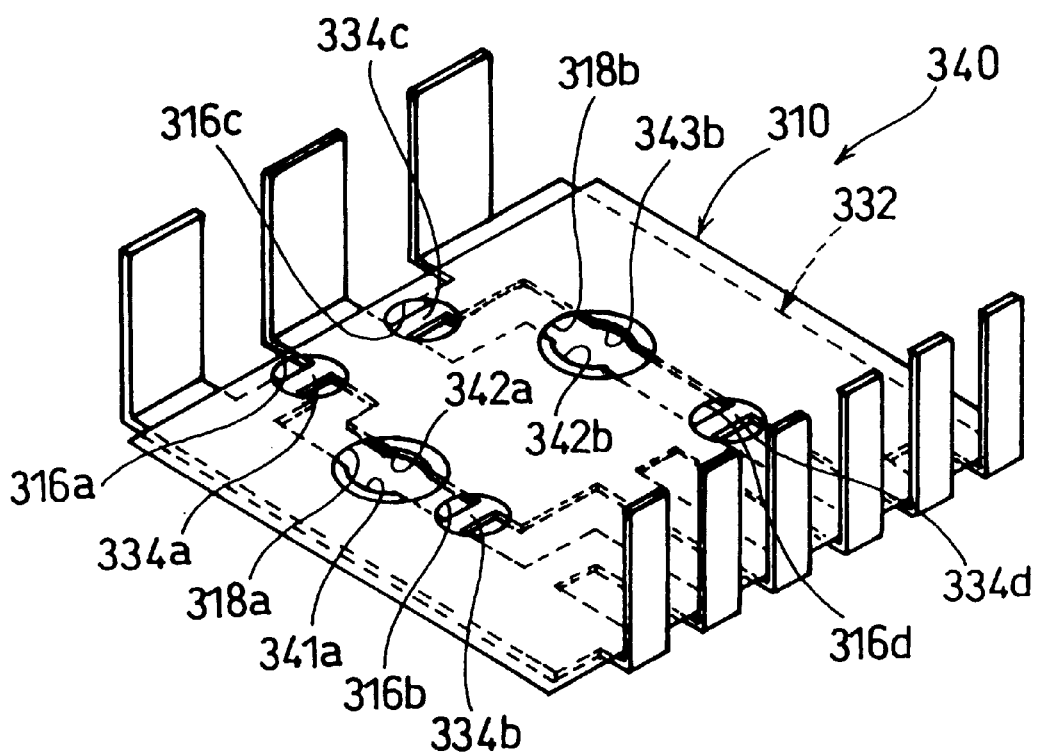

Next, as shown in FIG. 19, the coupled conductive material 332 is attached to the rear side of the film 310 (hereinafter called film-attached coupled conductive material 340).

Next, as shown in FIG. 20, the coupling parts 334a to 334d are eliminated on the film-attached coupled conductive material 340 by punching with a punching machine, and simultaneously, the cutout parts 331a and 331b of the first conductive material 321, the cutout parts 332a to 332d of the second conductive material 322, and the cutout parts 333c and 333d of the third conductive material 323 are formed. At this time, the punching is carried out through the holes 316a to 316d of the film 310. Therefore, only the coupling parts 334a to 334d of the coupled conductive material 332 can be eliminated without punching on the film 310. Thus, three conductive materials consisting of the first to the third conductive materials 321, 322 and 323 are formed from the coupled conductive material 332.

As described above, the conductive portion device 300 shown in FIG. 16 can be produced.

Accordingly, with this manufacturing method, it is possible to obtain the effects as those of the first preferred embodiment.

Furthermore, with this manufacturing method, by a process of eliminating the coupling parts 334a to 334d of the coupled conductive material 332, the holes 302a to 302d can be made simultaneously. Therefore, this is more efficient than performing both the processes separately.

[Embodiment 5]

Figure 21:
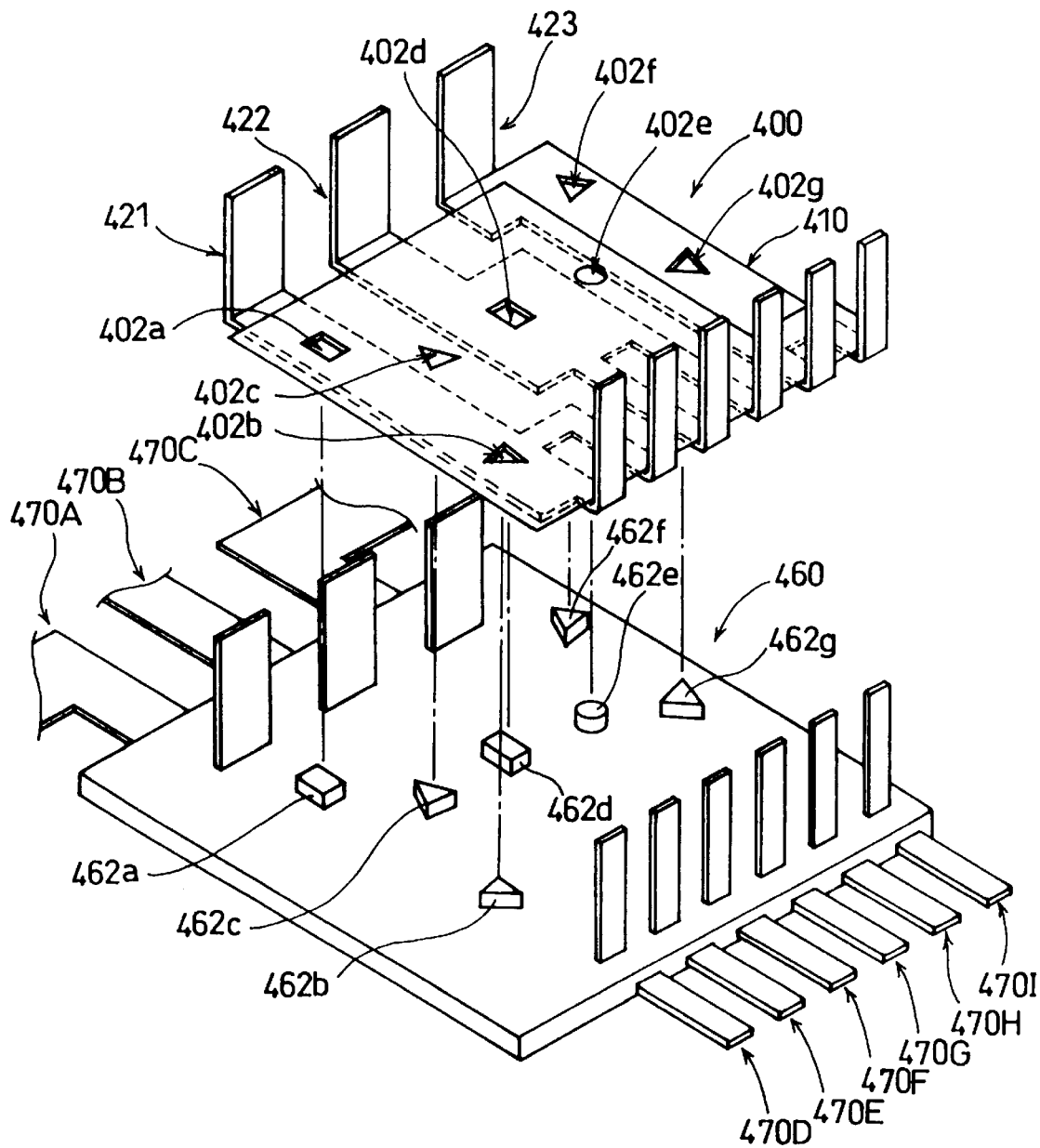
FIG. 21 is a perspective view showing a conductive portion device of a fifth preferred embodiment of the invention and an attaching base member to which the conductive portion device is attached.

Next, a fifth preferred embodiment which is a modification example of the fourth preferred embodiment is described on the basis of FIG. 21, centering around the points which are different from the fourth preferred embodiment.

A conductive portion device 400 can be attached to an attaching base member 460.

The attaching base member 460 is made of synthetic resin and is of sheet-like shape. Nine connecting members (first to ninth connecting members 470A to 470I) made of metal are attached so as to be embedded in the attaching base member 460.

Seven positioning protrusions 462a to 462g are formed at the attaching base member 460. The positioning protrusions 462a and 462d are substantially of square-prism shape. The positioning protrusions 462b, 462c, 462f and 462g are substantially of triangular-prism shape. The positioning protrusion 462e is substantially of circular-column shape.

The conductive portion device 400 may be formed by attaching the three conductive materials (conductive portions) consisting of a first conductive material 421, a second conductive material 422 and a third conductive material 423 adhered onto the rear side of the film 410.

Positioning holes 402a to 402g are formed on the conductive portion device 400. Each of the holes 402a to 402g is formed so as to correspond to the respective protrusions 362a to 362g of the attaching base member 460. That is, the positions of the respective holes 302a to 302g correspond to (are coincident with) the positions of the respective protrusions 462a to 462g of the attaching base member 460. Furthermore, the shape and size of the respective holes 402a to 402g are substantially the same as the shape and size of the cross section of the respective positioning protrusions 462a to 462g.

Furthermore, since the holes 402a and 402b are located at points where the film 410 and the first conductive material 421 overlaps to each other, they may be formed of holes formed at both the film 410 and the first conductive material 421. Since the holes 402c and 402e are located at points where only the film 410 exists (that is, no conductive materials 421 to 423 exist), they are formed at the film 410. Since the hole 402d is located at points where the film 410 and the second conductive material 422 overlaps to each other, the same is formed of a hole formed at both the film 410 and the second conductive material 422. Since the holes 402f and 402g are located at points where only the third conductive material 423 exists (that is, no film 410 exists), it is formed of a hole formed at the third conductive material 423.

As in the fourth preferred embodiment, it is possible to attach the conductive portion device 400 at an appointed position with the attaching base member 460 so that the respective positioning protrusions of the conductive portion device 400 are fitted into the holes 402a to 402g of the conductive portion device 400.

Furthermore, in this preferred embodiment, although seven sets of positioning protrusions 462a to 462g and holes 402a to 402g are provided, all the sets are not necessarily required. In other sets than a set of a column-like positioning protrusion 462e and a circular hole 402e, if any one of the sets is provided, the conductive portion device 400 can be located with respect to the attaching base member 460.

Furthermore, if two or more sets of the column-like positioning protrusions 462e and circular hole 402e exists, the conductive portion device 400 can be located with respect to the attaching base member 460.

Furthermore, as described above, even in a case where only one set of a triangular prism positioning protrusion 462c and a triangular hole 402c exists, the conductive portion device 460 can be located with the attaching base member 460. However, since the hole 402 is provided at only the film 410, it is necessary for the respective conductive materials 421 to 423 to be accurately positioned with respect to the film 410 in order to accurately locate the respective conductive materials (the first conductive material 421 to the third conductive material 423) with respect to the attaching base member 460.

Furthermore, the invention is not limited to each of the above-mentioned preferred embodiments, it is needless to say that the invention can be carried out in various kinds of variations and modifications on the basis of the knowledge of those skilled in this field.

What is claimed:

1. A conductive device comprising:

an insulation film;

a plurality of conductive materials attached to the insulation film; and at least one space formed between at least one pair of adjacent conductive materials;

wherein the space is defined at least in part by opposing end surfaces of the pair of adjacent conductive materials, and wherein the space is formed to engage a protrusion of an attaching base member.

2. A conductive device as defined in claim 1, wherein the end surfaces of the conductive materials are folded in a direction to cross the plane of the insulation film.

3. A method for manufacturing a conductive device, comprising the steps of:

attaching a coupled conductive material to an insulation film, the coupled conductive material comprising a plurality of conductive materials integrally connected at a coupling member;

removing the coupling member of the coupled conductive material attached to the insulation film, thereby forming a plurality of separated conductive materials;

forming a space between at least one pair of adjacent conductive materials; and, attaching a base member having at least one protrusion to the insulation film by inserting the protrusion into said space;

wherein the coupling member removing step and the space forming step are performed simultaneously and the space is at least partly defined by end surfaces of the at least one pair of adjacent conductive materials.

4. A method as defined in claim 3, wherein the step of removing the coupling member is performed by punching.

5. A method as defined in claim 3, further comprising the step of removing a part of the insulating film attached to the coupling member.

6. A conductive portion device assembly comprising an attaching base member having a protrusion, and a conductive device combined with the attaching base member, the conductive portion device comprising:

an insulation film;

a plurality of conductive materials attached to the insulation film; and a space formed between a pair of adjacent conductive materials;

wherein the space is partly defined by end surfaces of the adjacent conductive materials, and wherein the space engages the protrusion of the attaching base member.

* * * * *